US012700538B2

(12) United States Patent
Finck et al.

(10) Patent No.: US 12,700,538 B2
(45) Date of Patent: Aug. 4, 2026

(54) ENHANCING QUBIT-QUBIT INTERACTIONS BETWEEN SEPARATE CHIPS WITH SPIRAL RESONATORS

(71) Applicant: International Business Machines Corporation, Armonk, NY (US)

(72) Inventors: Aaron Finck, White Plains, NY (US); Cihan Kurter, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 572 days.

(21) Appl. No.: 18/355,596

(22) Filed: Jul. 20, 2023

(65) Prior Publication Data

US 2025/0029781 A1 Jan. 23, 2025

(51) Int. Cl.
*G06N 10/40* (2022.01)
*H01F 38/14* (2006.01)
*H10N 60/80* (2023.01)
*H10N 60/82* (2023.01)

(52) U.S. Cl.
CPC ............. *H01F 38/14* (2013.01); *G06N 10/40* (2022.01); *H10N 60/805* (2023.02); *H10N 60/82* (2023.02); *H01F 2038/143* (2013.01)

(58) Field of Classification Search
CPC ... G06N 10/40; H01F 38/14; H01F 2038/143; H01F 36/00; H01F 2027/2809; H01F 27/2804; H10N 69/00; H10N 60/805; H10N 60/82
See application file for complete search history.

(56) References Cited

U.S. PATENT DOCUMENTS

| | | | |
|---|---|---|---|
| 10,050,630 B2 | 8/2018 | Reagor et al. | |
| 10,134,972 B2 | 11/2018 | Oliver et al. | |
| 10,938,346 B2 | 3/2021 | Berkley et al. | |
| 2017/0193388 A1* | 7/2017 | Filipp | G06N 10/40 |
| 2019/0044051 A1* | 2/2019 | Caudillo | G06N 10/40 |
| 2019/0236476 A1* | 8/2019 | Pereverzev | C30B 29/02 |

(Continued)

FOREIGN PATENT DOCUMENTS

WO     2020162995 A2     8/2020

OTHER PUBLICATIONS

Kurter, "Superconducting RF Metamaterials Made With Magnetically Active Planar Spirals", IEEE Transactions on Applied Superconductivity, vol. 21, No. 3, Jun. 2011. (Year: 2011).*

(Continued)

*Primary Examiner* — Dave Misir
(74) *Attorney, Agent, or Firm* — Amin, Turocy & Watson, LLP

(57) ABSTRACT

Various systems and methods are presented regarding utilizing a spiral resonator to enhance coupling between a first inductor loop and a second inductor loop to enable coupling between a first qubit and a second qubit. Operation of the first inductor loop can be controlled by a flux-tunable TCQ coupler, wherein flux-tuning can adjust operation from an OFF state (no coupling between the first qubit and the second qubit) to an ON state (the first qubit and second qubit are coupled). The spiral resonator can be located at the center of, and in the same plane as the loop of the first inductor loop. The spiral resonator can enhance inductive coupling between the first loop inductor and the second loop inductor.

20 Claims, 13 Drawing Sheets

(56) References Cited

U.S. PATENT DOCUMENTS

| | | | |
|---|---|---|---|
| 2020/0280316 A1* | 9/2020 | Reagor | G06N 10/20 |
| 2021/0218367 A1* | 7/2021 | Berkley | H03B 15/003 |
| 2022/0121978 A1* | 4/2022 | Woods | H10N 60/12 |
| 2023/0006324 A1* | 1/2023 | Whittaker | H10N 60/12 |
| 2024/0078460 A1 | 3/2024 | Finck et al. | |

OTHER PUBLICATIONS

Kurter, et al., "Miniaturized Superconducting Metamaterials for Radio Frequencies" Applied Physics Letters 96, 253504, Jun. 24, 2010, 3 pages.
Silverstone et al. "Qubit entanglement between ring-resonator photon-pair sources on a silicon chip" Aug. 2015 (8 pages).
Gold et al., "Entanglement Across Separate Silicon Dies in a Modular Superconducting Qubit Device", arXiv:2102.13293v2 [quant-ph], Mar. 11, 2021, 09 pages.

* cited by examiner

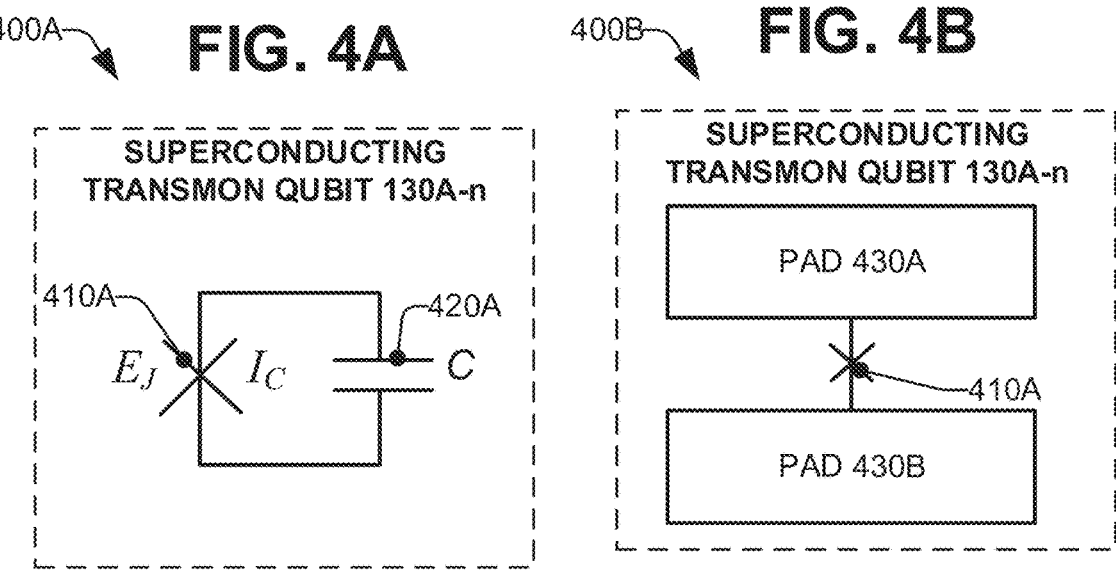
FIG. 4A
FIG. 4B
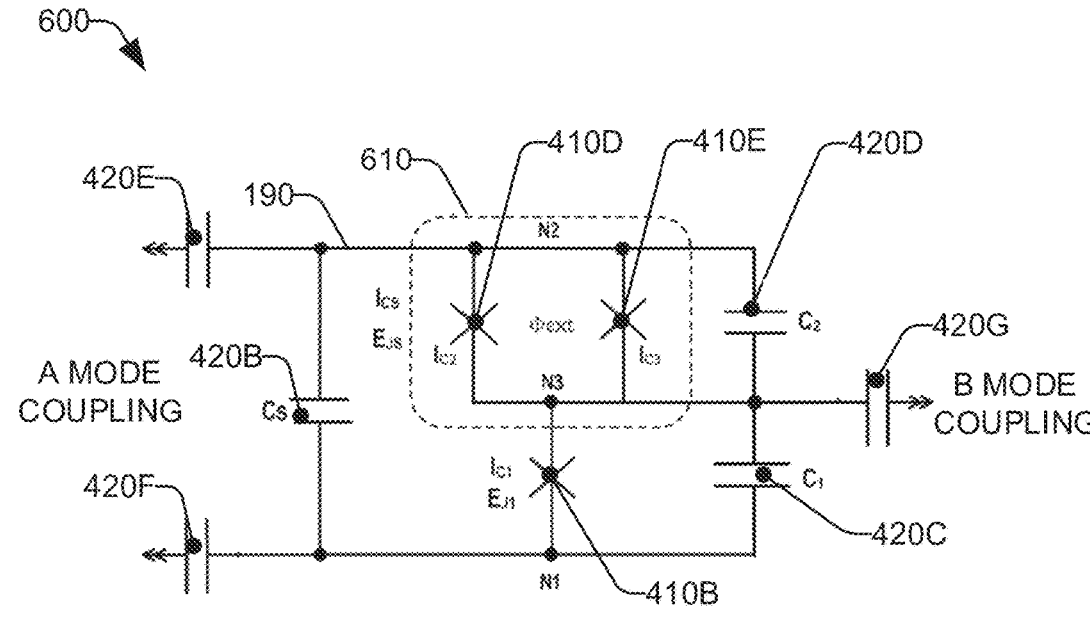
FIG. 6

800

900

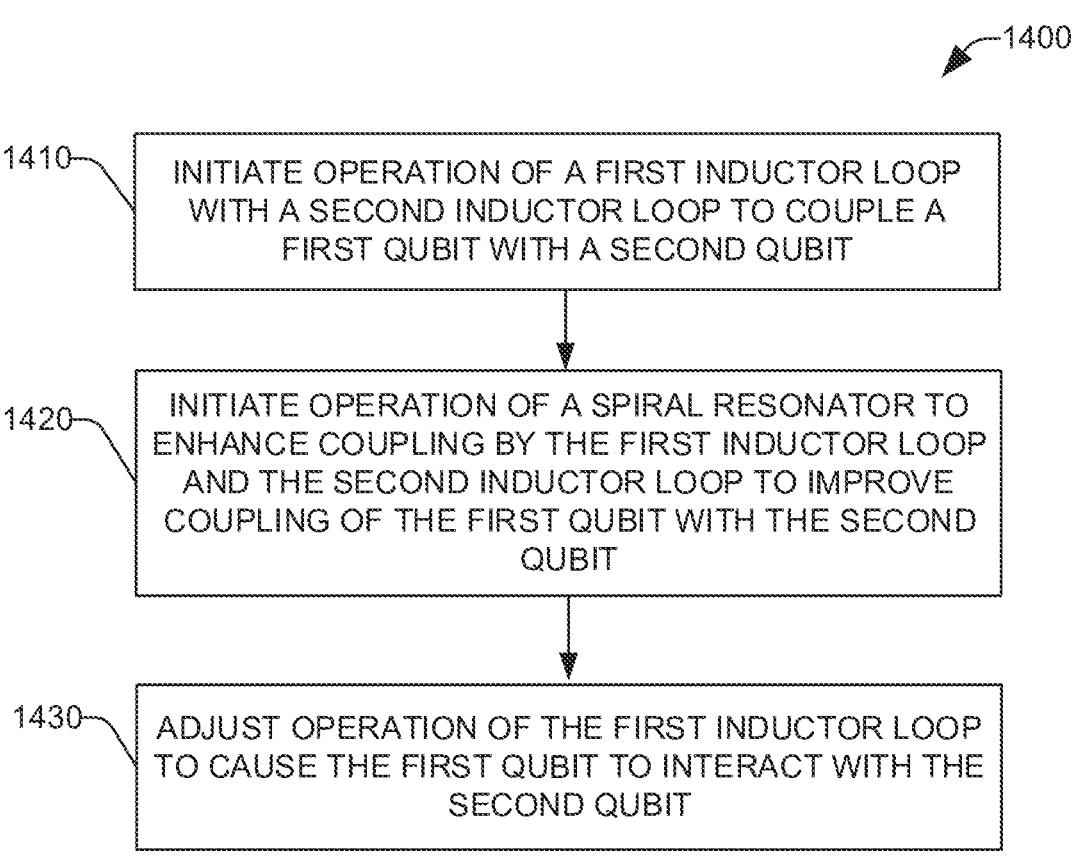

1400

1410— INITIATE OPERATION OF A FIRST INDUCTOR LOOP WITH A SECOND INDUCTOR LOOP TO COUPLE A FIRST QUBIT WITH A SECOND QUBIT

1420— INITIATE OPERATION OF A SPIRAL RESONATOR TO ENHANCE COUPLING BY THE FIRST INDUCTOR LOOP AND THE SECOND INDUCTOR LOOP TO IMPROVE COUPLING OF THE FIRST QUBIT WITH THE SECOND QUBIT

1430— ADJUST OPERATION OF THE FIRST INDUCTOR LOOP TO CAUSE THE FIRST QUBIT TO INTERACT WITH THE SECOND QUBIT

FIG. 14

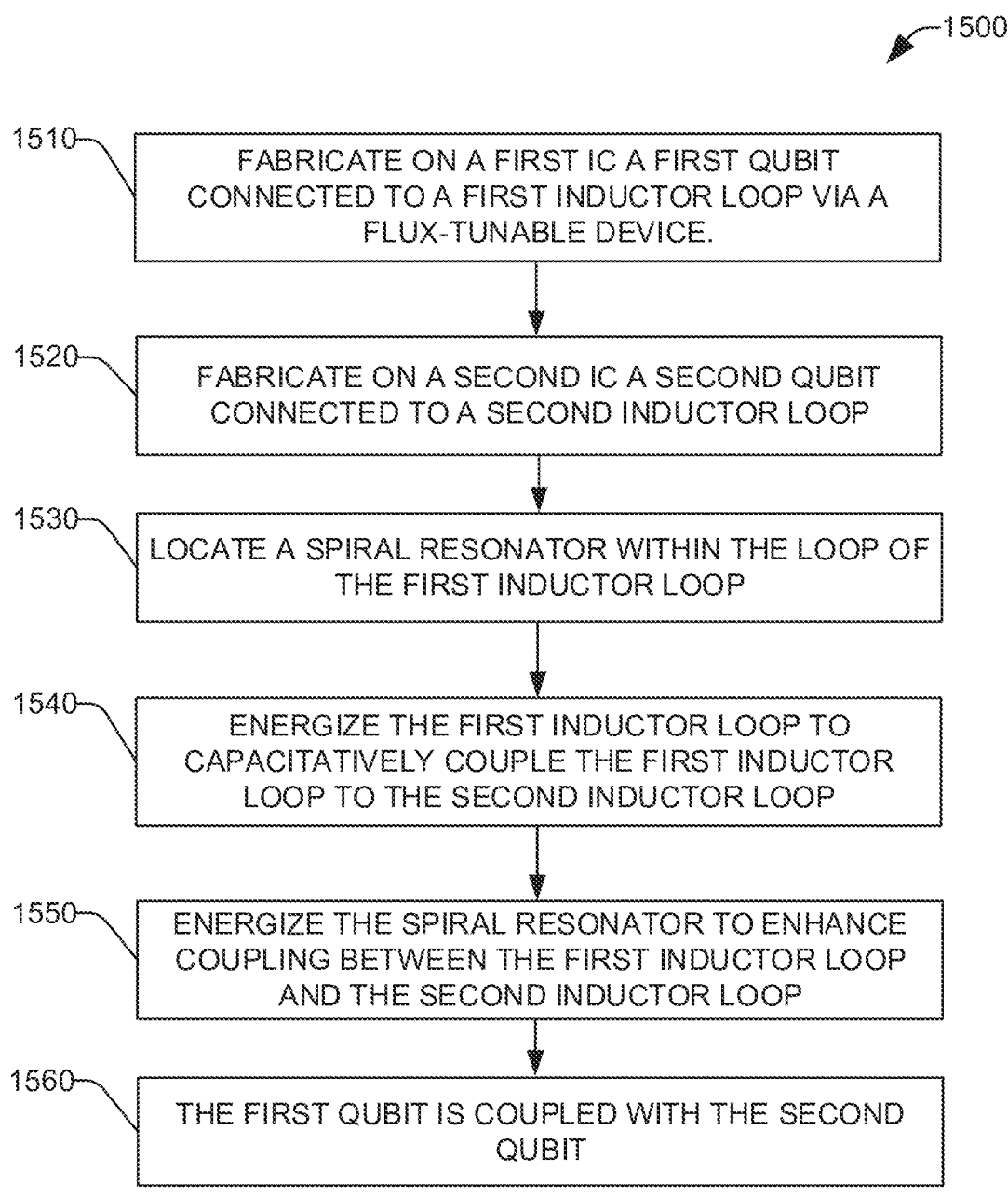

1500

1510 — FABRICATE ON A FIRST IC A FIRST QUBIT CONNECTED TO A FIRST INDUCTOR LOOP VIA A FLUX-TUNABLE DEVICE.

1520 — FABRICATE ON A SECOND IC A SECOND QUBIT CONNECTED TO A SECOND INDUCTOR LOOP

1530 — LOCATE A SPIRAL RESONATOR WITHIN THE LOOP OF THE FIRST INDUCTOR LOOP

1540 — ENERGIZE THE FIRST INDUCTOR LOOP TO CAPACITATIVELY COUPLE THE FIRST INDUCTOR LOOP TO THE SECOND INDUCTOR LOOP

1550 — ENERGIZE THE SPIRAL RESONATOR TO ENHANCE COUPLING BETWEEN THE FIRST INDUCTOR LOOP AND THE SECOND INDUCTOR LOOP

1560 — THE FIRST QUBIT IS COUPLED WITH THE SECOND QUBIT

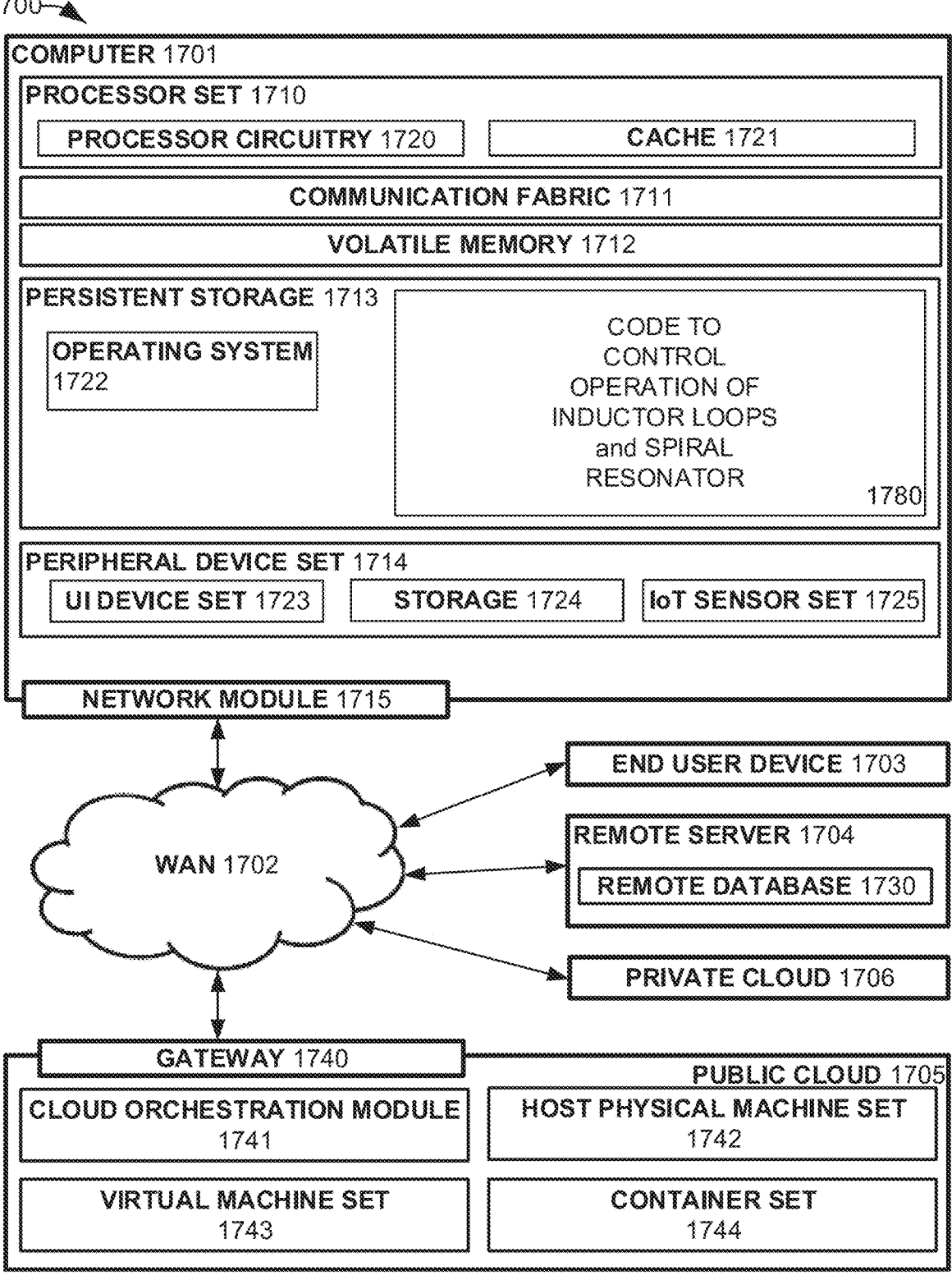

COMPUTER 1701

PROCESSOR SET 1710

PROCESSOR CIRCUITRY 1720     CACHE 1721

COMMUNICATION FABRIC 1711

VOLATILE MEMORY 1712

PERSISTENT STORAGE 1713

OPERATING SYSTEM 1722

CODE TO CONTROL OPERATION OF INDUCTOR LOOPS and SPIRAL RESONATOR     1780

PERIPHERAL DEVICE SET 1714

UI DEVICE SET 1723     STORAGE 1724     IoT SENSOR SET 1725

NETWORK MODULE 1715

WAN 1702

END USER DEVICE 1703

REMOTE SERVER 1704

REMOTE DATABASE 1730

PRIVATE CLOUD 1706

GATEWAY 1740

PUBLIC CLOUD 1705

CLOUD ORCHESTRATION MODULE 1741

HOST PHYSICAL MACHINE SET 1742

VIRTUAL MACHINE SET 1743

CONTAINER SET 1744

FIG. 17

ENHANCING QUBIT-QUBIT INTERACTIONS BETWEEN SEPARATE CHIPS WITH SPIRAL RESONATORS

BACKGROUND

The subject disclosure relates to quantum computing systems and more specifically to coupling of qubits located on disparate integrated circuits.

SUMMARY

The following presents a summary to provide a basic understanding of one or more embodiments described herein. This summary is not intended to identify key or critical elements, or delineate any scope of the different embodiments and/or any scope of the claims. The sole purpose of the Summary is to present some concepts in a simplified form as a prelude to the more detailed description presented herein.

In one or more embodiments described herein, systems, devices, computer-implemented methods, methods, apparatus and/or computer program products are presented that utilize a spiral resonator for coupling qubits in a quantum array(s).

According to one or more embodiments, a system is provided to couple a first qubit with a second qubit. The system can comprise a first substrate having located thereon a first quantum bit (qubit) located in a first quantum array connected to a first inductor loop coupled to a spiral resonator. In a further embodiment, the system can further comprise a second substrate, having located thereon a second qubit located in a second quantum array connected to a second inductor loop, wherein the first substrate and second substrate are separate, and the first qubit and the second qubit are coupled via electrical interaction between the first inductor loop and the second inductor loop. In an embodiment, the first qubit can be a first transmon qubit and the second qubit can be a second transmon qubit.

In a further embodiment, the system can further comprise a flux-tunable coupler configured to operate in two states, an ON state and an OFF state, wherein during operation in the ON state, the first qubit and the second qubit are coupled for entanglement to occur, and during operation in the OFF state, the first qubit and the second qubit are not coupled or entangled. In an embodiment, the flux-tunable coupler can further comprise a SQUID junction and operation of the flux-tunable coupler is switched between the ON state and the OFF state via an externally applied magnetic field. In a further embodiment, the flux-tunable coupler can comprise a superconducting multimode qubit coupler. In an embodiment, the flux-tunable coupler can comprise a tunable transmon coupler.

In a further embodiment, the spiral resonator can be operated at a frequency higher than the frequency of the first qubit or the second qubit. In another embodiment, the spiral resonator can have an operational frequency in the range of 5.5 GHZ to 6.5 GHZ. In a further embodiment, the spiral resonator can comprise at least niobium.

In another embodiment, a quantum computing system can comprise at least one processor and a memory coupled to the at least one processor and having instructions stored thereon, wherein, in response to the at least one processor, the instructions facilitate performance of operations, comprising controlling operation of a flux-tunable coupler to couple a first qubit with a second qubit, the first qubit can be connected to a first inductor loop and the second qubit can be coupled to a second inductor loop, wherein the second inductor loop can be proximate to the first inductor loop. In an embodiment, a spiral resonator can be located proximate to the first inductor loop, wherein the first qubit can be coupled to the second qubit via the first inductor loop and the second inductor loop.

In an embodiment, the first qubit can be a first transmon qubit and the second qubit can be a second transmon qubit. In another embodiment, the first qubit can be located on a first integrated circuit (IC) and the second qubit can be located on a second IC, the first IC and the second IC can be co-located in a qubit array.

In a further embodiment, the flux-tunable coupler can be configured to operate in two states, an ON state and an OFF state, wherein during operation in the ON state, the first qubit and the second qubit are coupled for entanglement to occur, and during operation in the OFF state, the first qubit and the second qubit are not coupled, wherein the flux-tunable coupler is connected to the first inductor loop. In another embodiment, the flux-tunable coupler can further comprise a SQUID junction and an operation of the flux-tunable coupler is switched between the ON state and the OFF state via application of flux to the SQUID junction.

In another embodiment, the spiral resonator can have a resonant frequency higher than the frequency of the first qubit or the second qubit during operation of the flux-tunable coupler. In a further embodiment, the spiral resonator can have a resonant frequency in the range of 5.5 GHz to 6.5 GHZ.

In other embodiments, elements described in connection with the disclosed systems can be embodied in different forms such as computer-implemented methods, computer program products, or other forms. In an embodiment, the computer-implemented method can comprise employing a processor and memory to instruct computer executable components to control operation of a flux-tunable coupler to couple a first qubit with a second qubit, the first qubit is connected to a first inductor loop and the second qubit is coupled to a second inductor loop, wherein the second inductor loop is proximate to the first inductor loop, and a spiral resonator is located proximate to the first inductor loop, wherein the first qubit is coupled to the second qubit via the first inductor loop and the second inductor loop.

In an embodiment, the flux-tunable coupler can be connected to the first inductor loop and further comprises a SQUID junction and an operation of the flux-tunable coupler is switched between the ON state and the OFF state via application of flux to the SQUID junction, during operation in the ON state, the first qubit and the second qubit are coupled for entanglement to occur, and during operation in the OFF state, the first qubit and the second qubit are not coupled.

In a further embodiment, the spiral resonator can have a resonant frequency higher than the frequency of the first qubit or the second qubit during operation of the flux-tunable coupler. In a further embodiment, the first qubit can be a first transmon qubit and the second qubit can be a second transmon qubit.

DESCRIPTION OF THE DRAWINGS

One or more embodiments are described below in the Detailed Description section with reference to the following drawings:

FIGS. 4A-B present schematics illustrating structural representation of a transmon qubit, in accordance with one or more embodiments.

FIG. 6 presents a schematic of a tunable multimode qubit coupler (TCQ), which can be utilized to couple qubits, in accordance with one or more embodiments.

FIG. 14 illustrates a computer-implemented methodology to enhance coupling between qubits in a quantum computing system.

FIG. 15 illustrates a computer-implemented methodology to enhance coupling between qubits in a quantum computing system.

FIG. 17 depicts an example schematic block diagram of a computing environment with which the disclosed subject matter can interact/be implemented at least in part, in accordance with various aspects and implementations of the subject disclosure.

DETAILED DESCRIPTION

Figure 1:
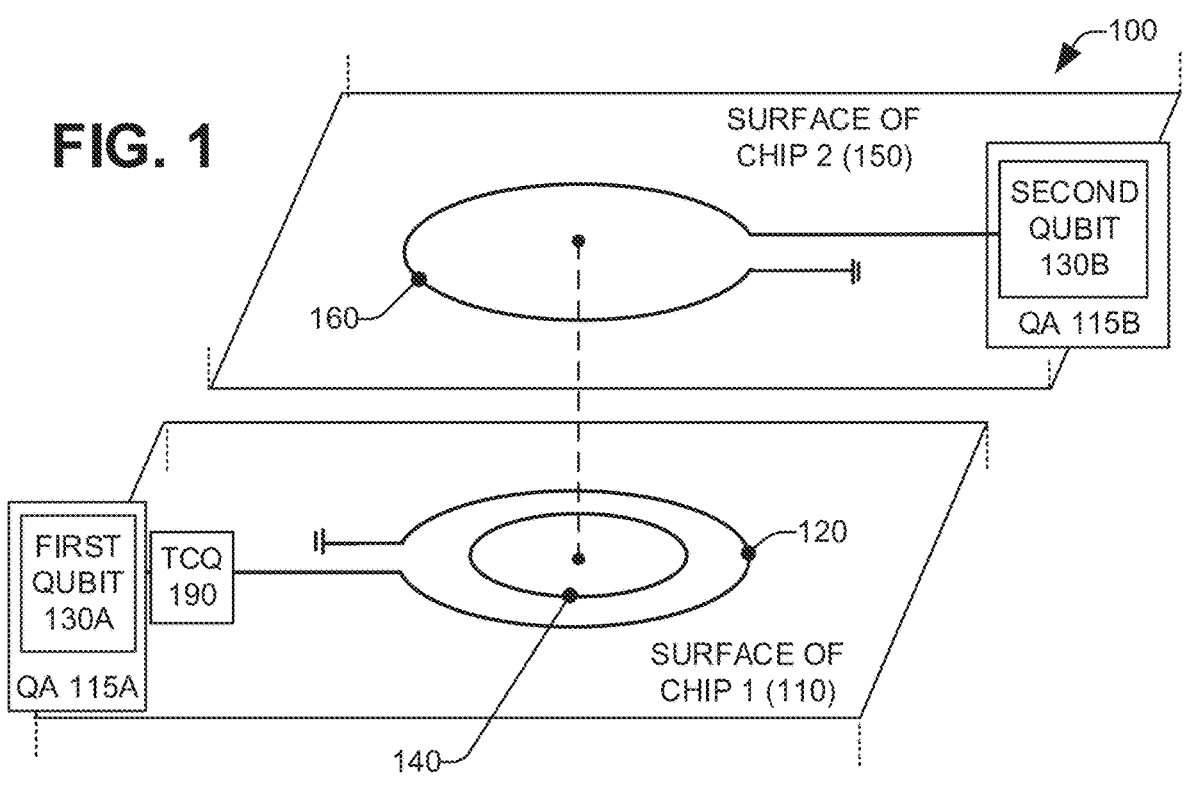
FIG. 1 presents a schematic illustrating a structure configured to couple a first qubit with a second qubit, where the first qubit and second qubits are located on different substrates, in accordance with an embodiment.

The following detailed description is merely illustrative and is not intended to limit embodiments and/or application or uses of embodiments. Furthermore, there is no intention to be bound by any expressed and/or implied information presented in any of the preceding Background section, Summary section, and/or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details. In the following, n denotes an integer greater than zero.

The various systems, methods, and embodiments generally relate to superconducting quantum computing and, in particular, superconducting quantum systems and devices that are implemented using superconducting quantum bits (qubits). A quantum computing system is implemented using circuit quantum electrodynamics (QED) devices, which utilize the quantum dynamics of electromagnetic fields in superconducting circuits, which include qubits, to generate and process quantum information. In general, qubits are electronic circuits which are implemented using components such as superconducting tunnel junctions (e.g., Josephson junctions), inductors, and/or capacitors, etc., and which behave as quantum mechanical anharmonic (non-linear) oscillators with quantized states, (e.g., when cooled to cryogenic temperatures). A qubit can be effectively operated as a two-level system using a ground state and first excited state of the qubit due to the anharmonicity imparted by a non-linear inductor element (e.g., Josephson inductance) of the qubit, which allows the ground and first-excited states to be uniquely addressed at a transition frequency of the qubit, without significantly disturbing the higher-excited states of the qubit.

Various types of quantum information processing operations can be implemented using a quantum processor comprising multiple qubits, wherein the qubits can be coherently controlled, placed into quantum superposition states (via, e.g., single-gate operations), exhibit quantum interference effects, and become entangled with one another (via, e.g., entanglement gate operations). The fidelity of quantum gate operations can be adversely impacted by unwanted crosstalk (e.g., residual static ZZ interactions) between adjacent qubits. For example, unwanted crosstalk between qubits can cause the transition frequency of one qubit to be dependent on the state of one or more neighboring qubits. As quantum processors are scaled with increasing numbers of qubits and higher integration densities, such unwanted crosstalk becomes increasingly problematic.

In conjunction with mitigating crosstalk, manufacturers are also looking at how to simplify production/fabrication of qubit arrays. For example, rather than construct a qubit array as a single integrated circuit (IC, chip, substrate), it is desired to provide coupling between qubits that are fabricated on different ICs. It is easier to fabricate smaller ICs and connect/couple the smaller ICs together, as opposed to fabricating a larger, single IC.

Per the various embodiments presented herein, a spiral resonator can be utilized to enhance coupling between a first qubit and a second qubit, wherein coupling is provided via a first inductor loop coupled to a second inductor loop. A flux tunable coupler can be utilized to control operation of the first inductor loop with regard to coupling (e.g., inductive coupling) with the second inductor loop. Operation of the spiral resonator can enhance the magnitude of coupling (e.g., inductive coupling), and further can act to reduce unwanted effects of crosstalk, etc. Operation of the flux tunable coupler can transition between OFF state (wherein the first qubit and second qubit are decoupled) and ON state (wherein the first qubit and second qubit are coupled).

1. Overview

Turning now to FIG. 1, schematic 100, illustrates a structure configured to couple a first qubit with a second qubit, where the first qubit and second qubits are located on different substrates, in accordance with an embodiment. As shown, a first substrate 110 has located thereon, a first inductor loop 120, wherein the first inductor loop 120 is connected to a first qubit array 115A that further includes a first qubit 130A. As further shown, a second substrate 150 has located thereon a second inductor loop 160, wherein the second inductor loop 160 is connected to a second qubit array 115B that further includes a second qubit 130B. In an embodiment, the first qubit array 115A and the second qubit array 115B can be proximate to each other (e.g., combine to form a common qubit array) or are located at some distance further away (e.g., the first qubit array 115A and the second qubit array 115B are distinct/disparate structures). Further fabricated on the surface of IC 110 is a spiral resonator 140, wherein the spiral resonator 140 can be configured to increase signal transmission/coupling between the first inductor loop 120 and the second inductor loop 160, and accordingly, coupling between the first qubit 130A and the second qubit 130B. In an embodiment, qubit 130A can operate/function as a data qubit while qubit 130B can operate/function as an auxiliary qubit, or vice-versa. As further described, tuning of the interaction between the first inductor loop 120, the second inductor loop 160, and the spiral resonator 140 can be performed by a superconducting multimode qubit 190, also known as a superconducting tunable coupler qubit, further referred to herein as a TCQ coupler 190.

In an embodiment, the first inductor loop 120, the second inductor loop 160, and the spiral resonator 140 can be fabricated from any suitable material, e.g., superconducting niobium. In another embodiment, the first surface 115 of first IC 110 and the second surface 155 of second IC 150 can be formed from any suitable material, e.g., a silicon semiconductor. In another embodiment, the spiral resonator 140 can be formed with line width and line separation in the order of 5-10 microns, having 10-15 windings, with an approximate inner radius of 200 microns and an approximate outer radius of 300 microns. The first inductor loop 120 and the second inductor loop 160 can have a radius of approximately 500 microns. It is to be appreciated that the foregoing dimensions and materials are simply example/arbitrary values, and any suitable dimension, number of windings, material(s) can be utilized in accordance with one or more embodiments presented herein, e.g., to enhance coupling by the first inductor loop 120 and the second inductor loop 160, and accordingly interaction between the first qubit 130A and the second qubit 130B, as a function of the resonant frequency of the spiral resonator 140.

Figure 2:
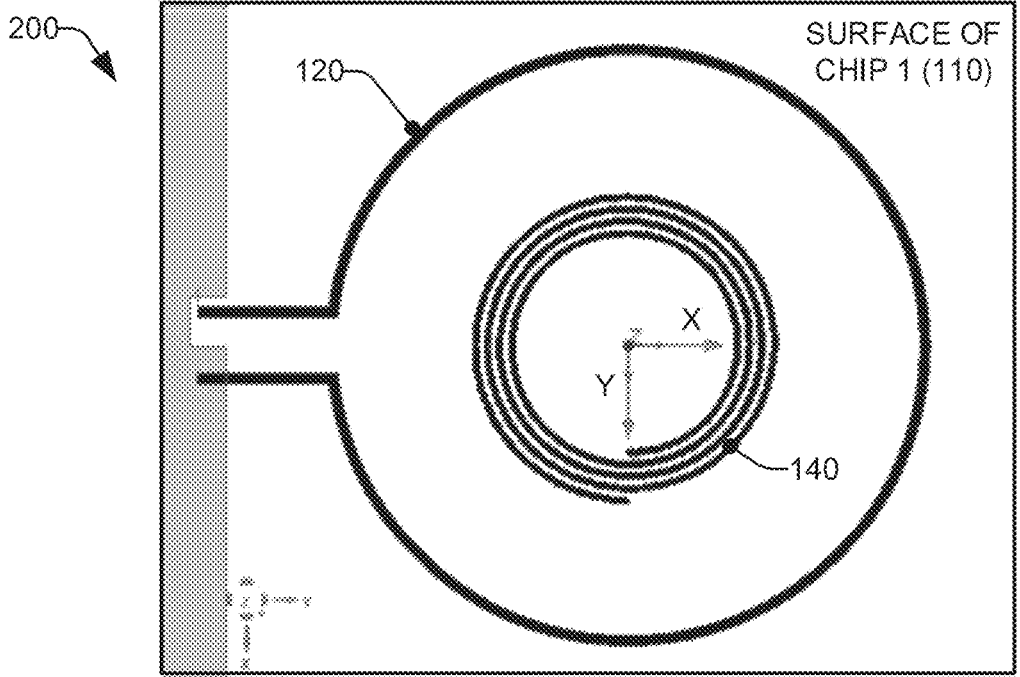
FIG. 2 presents a schematic illustrating incorporation of a spiral resonator with a inductor loop to facilitate coupling between qubits in a quantum computer system, in accordance with an embodiment.

FIG. 2 presents a schematic 200 illustrating incorporation of a spiral resonator with a inductor loop to facilitate coupling between qubits in a quantum computer system, in accordance with an embodiment. FIG. 2 presents a view of the surface 115 of the first IC 110, illustrating the spiral resonator 140 located inside the inductor loop 120. As shown, the spiral resonator 140 can be positioned/located at the center of the inductor loop 120 and in the same plane (X-Y) as the inductor loop 120.

Figure 3:
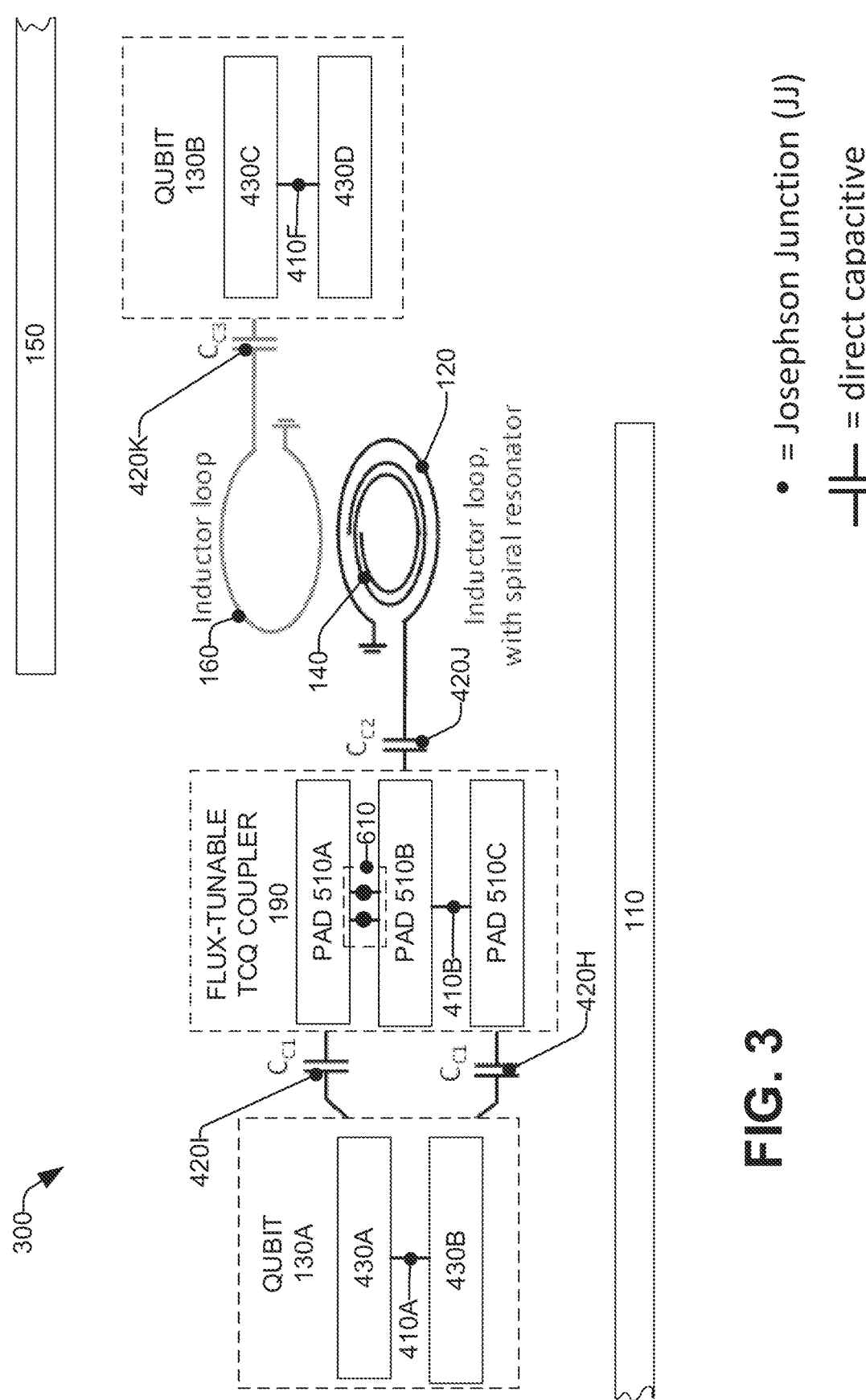
FIG. 3 presents a schematic illustrating a system to facilitate coupling between qubits in a quantum computer system, in accordance with an embodiment.

FIG. 3, schematic 300, illustrates a system to facilitate coupling between qubits in a quantum computer system, in accordance with an embodiment. FIG. 3 illustrates implementation of a spiral resonator 140 in a system to enable interaction between the first qubit 130A and the second qubit 130B. However, to enable understanding of the various embodiments presented herein, respective components utilized in the system 300 are first presented and described in FIGS. 4A-10.

Turning initially to FIGS. 4A-B, schematics 400A and 400B illustrate structural representation of a superconducting transmon qubit, in accordance with one or more embodiments. In an embodiment, what is referenced in FIG. 1 as first qubit 130A can comprise a first transmon qubit, and similarly, what is referenced in FIG. 1 as a second qubit 130B can also comprise a second transmon qubit.

Transmon qubits 130A-n represent a superconducting transmon (transmission line shunted plasma oscillation) qubit, which is a type of superconducting qubit comprising a superconducting tunnel junction device (e.g., Josephson junction) connected in parallel with a capacitor. In one or more embodiments, superconducting transmon qubits 130A-n can be utilized to implement data qubits and/or auxiliary qubits. FIG. 4A presents a schematic lumped-element circuit representation 400A of a superconducting transmon qubit (aka transmon qubit) 130A-n, and FIG. 4B schematically illustrates a planar circuit configuration 400B of the transmon qubit 130A-n of FIG. 4A.

As shown in FIG. 4A, the transmon qubit 130A-n comprises a superconducting tunnel junction device 410A and a capacitor 420A which are connected in parallel. In an embodiment, the superconducting tunnel junction device 410A is a Josephson tunnel junction device (Josephson junction) 410A having a Josephson energy $E_J$ and critical current $I_C$. It is to be noted that identifiers 410A-n are used throughout the specification to denote respective Josephson tunnel junction devices//tunnel junctions. Further, identifiers 420A-n are also used throughout the specification to denote respective capacitors. In an embodiment, the capacitor 420A has a capacitance C. The Josephson junction 410A comprises a small junction capacitance which is omitted from FIG. 4A for ease of illustration. The capacitance C of the capacitor 420A is large relative to the junction capacitance of the Josephson junction 410A. The Josephson junction 410A can function as a non-linear inductor which, when shunted with the capacitor 420A, forms an anharmonic LC oscillator with individually addressable energy levels (e.g., two lowest energy level corresponding to the ground state $|0\rangle$ and the first excited state $|1\rangle$ ).

As shown in FIG. 4B, the planar circuit configuration 401 of transmon qubit 130A-n comprises a first superconducting pad 430A, a second superconducting pad 430B, and a Josephson junction 410A that is coupled to, and disposed between, the first and second superconducting pads (pads) 430A and 430B. The first and second pads 430A and 430B comprise electrodes of a coplanar parallel-plate capacitor structure which correspond to the capacitor 420A (with the capacitance C) of the transmon qubit 130A-n.

Transmon qubits 130A-n can be utilized in a quantum computing system(s), (FIG. 3), as transmon qubits provide good coherence times, and have relatively simple structures facilitating coupling with other superconducting circuit elements, and qubit readout resonators, etc. To control and readout the state of a transmon qubit 130A-n, structures can be designed to capacitively or inductively couple the transmon qubit to other circuit elements, including microwave and flux drive lines, readout resonators, and couplers. In addition, transmon qubits 130A-n can be designed to have a relatively high anharmonic spectrum, in which the frequency separation between the computational states and the non-computational states, is relatively high, enabling efficient use of a transmon qubit 130A-n as a two-level quantum system.

In particular, the operating frequency (aka, transition frequency) of a transmon qubit 130A-n is the frequency that corresponds to a difference in the energy between the ground state $|0\rangle$ and the first excited state $|1\rangle$ of the qubit 130A-n. With transmon qubits 130A-n, while higher energy levels are available for a given qubit 130A-n (e.g., $|2\rangle$ , $|3\rangle$ , etc.), the quantum system is designed to isolate the two lowest energy levels (i.e., ground state $|0\rangle$ and first excited state $|1\rangle$ ) of the qubits 130A-n, and thereby utilize each qubit 130A-n as a basic two-level system for quantum computation, while ignoring higher energy states. The term "anharmonicity" as used herein refers to a difference between (i) the frequency ($f_{01}$) to transition from the ground state $|0\rangle$ to the first excited state $|1\rangle$ and (ii) the frequency ($f_{12}$) to transition from first excited state $|1\rangle$ to the second excited state $|2\rangle$, of the qubit 130A-n.

The Josephson junction 410A of the transmon qubit 130A-n can be designed to have a target critical current $I_c$ and Josephson energy $E_J$ to achieve a given anharmonicity for the qubit potential. For a Josephson junction 410A, a resulting superconducting current I which flows through the Josephson junction, and junction voltage V across the Josephson junction, are related to the superconducting phase difference $\varphi = \varphi_1 - \varphi_2$ as follows: $I = I_c \sin \varphi$, and $$V = \frac{\Phi_0 d_\varphi}{2\pi dt},$$

where $I_c$ denotes the critical current of the Josephson junction, and where $$\Phi_0 = \frac{h}{2e}.$$

The critical current of the Josephson Junction 410A is determined by $$I_c = \frac{2eEj}{h},$$

wherein the critical current $I_c$ denotes a maximum amount of current that can coherently tunnel through the Josephson junction 410 (exhibiting no dissipation). The critical current $I_c$ of the Josephson Junction 410A is a function of the Josephson energy $E_J$ of the Josephson junction 410A, wherein $$E_J = L_J I_c^2,$$

wherein $L_J$ denotes the Josephson inductance of the Josephson junction 410A. Based on the standard relation for inductance $$V = L_J \left( \frac{dI}{dt} \right),$$

the Josephson inductance $L_J$ is determined as:

$$L_J = \frac{\Phi_0}{2\pi I_c \cos \varphi},$$

which shows that $L_J$ is non-liner with respect to $\varphi$.

Figures 5A, 5B, 5C:
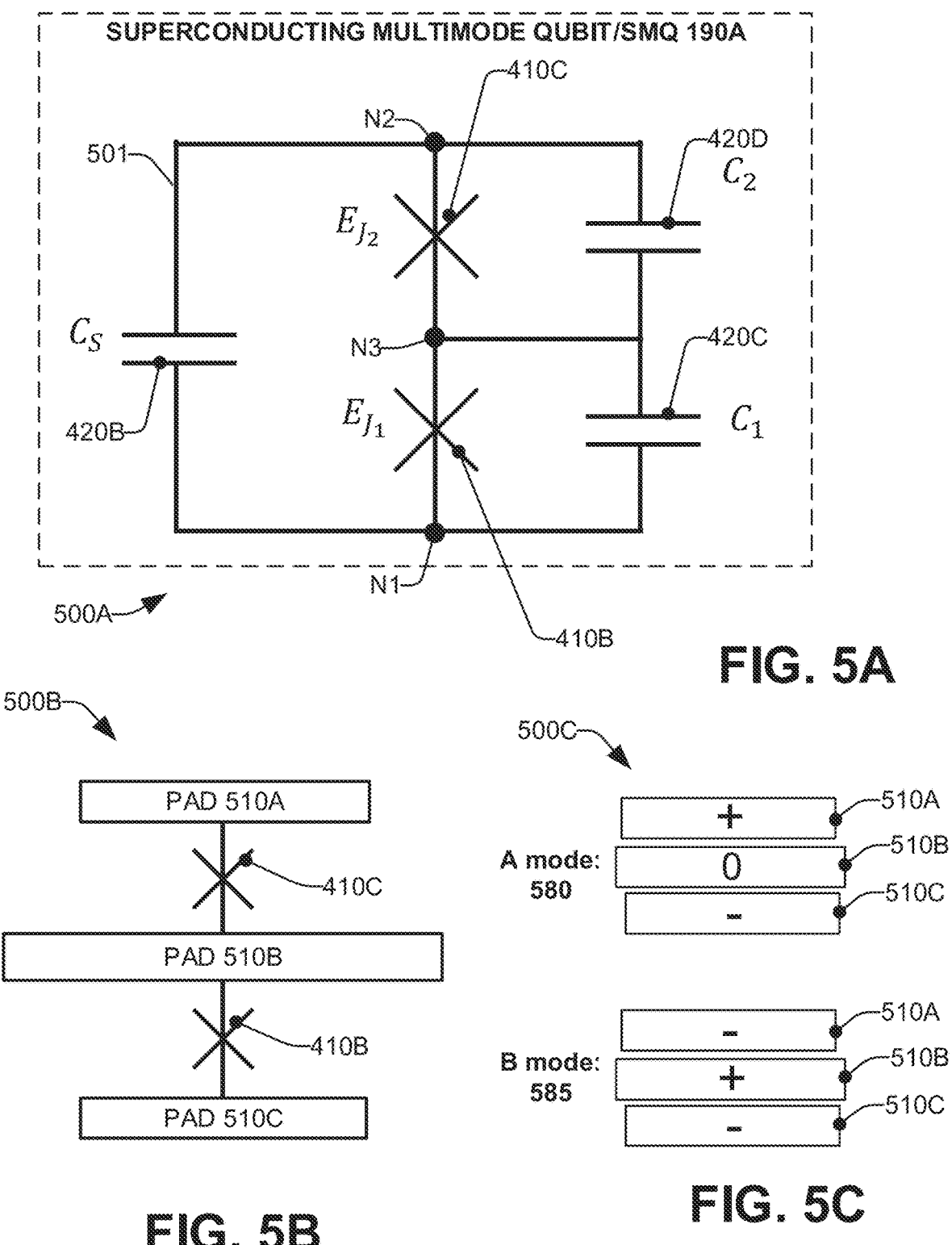
FIGS. 5A-C presents schematics illustrating a qubit that can be utilized in a system configured to couple a first qubit to a second qubit, in accordance with an embodiment.

Another type of superconducting qubit that can be utilized in a quantum system includes a superconducting multimode qubit. FIGS. 5A-C, schematics 500A-C, illustrate a superconducting qubit that can be utilized in a system configured to couple a first qubit to a second qubit, in accordance with an embodiment. FIG. 5A illustrates a superconducting multimode qubit which can be utilized via one or more embodiments presented herein. The superconducting multimode qubit comprises a multimode two-junction qubit architecture, as presented in FIGS. 5A-C. More specifically, FIG. 5A is a schematic lumped-element circuit representation of superconducting multimode qubit 190, also known as a superconducting tunable coupler qubit, SMQ 190A having a circuit 501. SMQ 190A forms the basic structure for the tunable superconducting multimode qubit coupler, TCQ 190 as further described herein (per FIG. 6). SMQ 190A comprises a shunt capacitor 420B, and two capacitively-shunted Josephson junctions, a first Josephson junction 410B and a second Josephson junction 410C connected in series between a first node N1 and a second node N2 of the SMQ 190A. The first capacitively-shunted Josephson junction 410B comprises the first Josephson junction 410B connected in parallel with a first capacitor 420C. The second capacitively-shunted Josephson junction 410C comprises the second Josephson junction 410C connected in parallel with a second capacitor 420D. The shunt capacitor 420B has a capacitance $C_S$, the Josephson junction 410B has a Josephson energy $E_{J1}$, the Josephson junction 410C has a Josephson energy $E_{J2}$, capacitor 420C has a capacitance $C_1$, and capacitor 420D has a capacitance $C_2$. The first and second capacitively-shunted Josephson junctions 410B-C are coupled to a middle node N3.

FIG. 5B schematically illustrates a planar circuit configuration of the SMQ of FIG. 5A, according to an embodiment. More specifically, FIG. 5B schematically illustrates a planar representation of SMQ 190A. As shown in FIG. 5B, SMQ 190A comprises a first (top) superconducting pad 510A, a second (middle) superconducting pad 510B, a third (bottom) superconducting pad 510C, wherein the Josephson junction 410B is coupled to and between the second and third pads 510B and 510C, and the second Josephson junction 410C is coupled to and between the first and second pads 510A and 510B. In the presented configuration, the superconducting pads 510A-C can comprise planar capacitor electrodes which form coplanar parallel-plate capacitor structures. For example, per FIG. 5B, the first and third pads 510A and 510C can comprise planar capacitor electrodes of the shunt capacitor 420B of FIG. 5A. In addition, the first and second pads 510A and 510B can comprise planar capacitor electrodes of the capacitor 420D of FIG. 5A, and the second and third pads 510B and 510C can comprise planar capacitor electrodes of the capacitor 420C of FIG. 5A. The first, second, and third pads 510A, 510B, and 510C correspond, respectively, to the first, second, and third nodes N2, N3, and N1 in FIG. 5A.

The SMQ 190A can have two modes of excitations with distinct frequencies and distinct spatial symmetries. More specifically, SMQ 190A can have two distinct modes of excitation corresponding to symmetric and antisymmetric combinations of excitations associated with the two Josephson junctions 410B-C, wherein the two distinct, normal modes include (i) a low-frequency "bright" mode (referred to herein as A mode) which comprises a non-zero dipole moment, and (ii) a high-frequency "dark" mode (referred to herein as B mode) which lacks a dipole moment and does not couple to external fields. FIG. 5C schematically illustrates the two distinct modes of excitations of the SMQ 190A of FIGS. 5A and 5B, in which the "bright" mode is depicted as an A mode 580, and the "dark" mode is depicted as a B mode 585.

As schematically shown in FIG. 5C, the A mode 580 comprises a charge pattern in which, at a point in time, the first and third pads 510A and 510C have opposite charge, and the second (middle) pad 510B has a net zero charge.

Alternatively, the B mode 585 comprises a charge pattern in which, at another point in time, the first and third pads 510A and 510C have the same charge, and the second pad 510B has a charge that is opposite the charge on the first and third pads 510A and 510B. The A and B modes have different frequencies, e.g., a mode frequency $f_B$ of the B mode 585 is higher/greater than a mode frequency $f_A$ of the A mode 580, which allows individual excitation of one mode over the other mode.

To implement scalable quantum computing systems (e.g., a quantum processor) using superconducting qubits, it is important to minimize or eliminate crosstalk or any unwanted ZZ interactions between coupled or neighboring qubits to, e.g., enable independent qubit control for high-fidelity single-qubit gate operations, and implement high-fidelity entanglement gates (e.g., two-qubit gates) between qubits 130A and 130B. As noted above, an entanglement gate is an operation in which external fields (e.g., microwave signals) are applied to a quantum processor to create an entangled state between two or more separate qubits 130A-n. For example, a controlled-phase gate (referred to herein as CPHASE gate) between two qubits is a type of entangling gate in which one qubit (e.g., target qubit 130B) acquires a phase-shift if and only if both qubits 130A and 130B are in their first excited state.

ZZ interaction is a type of longitudinal interaction between two qubits or modes, in which the excitation of one qubit or mode causes a shift in the transition frequency of the other qubit or mode. In certain instances, ZZ interaction provides a way to entangle two different qubits (e.g., qubits 130A and 130B) and create, e.g., a CPHASE gate, because a state-dependent shift in qubit frequency can be made equivalent to a state-dependent phase-shift. ZZ interactions are sometimes referred to as longitudinal coupling or denoted as chi or 2-chi coupling. ZZ interactions can be utilized in quantum error correction (e.g., parity checking) such as when one or more qubits are coupled to an auxiliary qubit. In an embodiment, ZZ interaction can be prone to deleterious effects such as crosstalk such as static noise in the system. By utilizing the various embodiments herein to increase ZZ interaction when desired, the deleterious effects of crosstalk, etc., can be mitigated.

In various embodiments, superconducting multimode qubit couplers can be utilized for coupling qubits, e.g., qubit 130A with qubit 130B to enable exchange interactions for qubit entanglement while suppressing crosstalk between the qubits 130A-n. For example, in an embodiment, a flux-tunable superconducting multimode qubit coupler can be implemented to couple qubits 130A-n. In an embodiment, a flux-tunable superconducting multimode qubit coupler can be based on the multimode two-junction superconducting qubit architecture, e.g., SMQ 190A presented in FIGS. 5A-C.

FIG. 6 presents a tunable superconducting multimode qubit coupler (TCQ), which can be utilized to couple qubits, in accordance with one or more embodiments. FIG. 6 presents a schematic lumped-element circuit representation of a tunable superconducting multimode qubit coupler, TCQ 190. TCQ 190 comprises a multimode, two-junction super-conducting qubit architecture being similar to/based on the SMQ 190A, however, the Josephson junction 410C of SMQ 190A has been replaced with a superconducting quantum interference device (SQUID) 610, wherein the SQUID 610 enables TCQ 190 to be flux-tunable. The SQUID 610 forms a superconducting loop (referred to as SQUID loop) through which an external magnetic flux can be threaded to control the interaction (e.g., facilitate exchange interaction or suppress crosstalk) between qubits 130A-n coupled together via the TCQ 190.

As shown in FIG. 6, TCQ 190 comprises shunt capacitor 420B (with capacitance $C_S$) and two capacitively-shunted superconducting Josephson tunnel junctions connected in series between a first node N1 and a second node N2 of the TCQ 190. A first capacitively-shunted Josephson tunnel junction comprises a first Josephson junction 410B connected in parallel with a first capacitor 420C (with capacitance $C_1$). The first Josephson tunnel junction device 410B comprises a critical current of $I_{C1}$ and Josephson energy $E_{J1}$. A second capacitively-shunted Josephson junction comprises the SQUID 610 connected in parallel with second capacitor 420D (with capacitance $C_2$). SQUID 610 comprises a first Josephson junction 410D and a second Josephson junction 410E, which are connected in parallel between node N2 and node N3 of the TCQ 190, and form a superconducting loop.

SQUID 610 effectively operates as a single Josephson junction with an effective critical current $I_{CS}$ and Josephson energy $E_{JS}$ which is tunable by applying an external magnetic field, $\Phi_{ext}$, to the superconducting loop formed by the parallel-connected Josephson junctions 410D and 410E. Accordingly, SQUID 610 enables TCQ 190 to be tuned through the application of a target external magnetic field $\Phi_{ext}$, which is applied by a flux-bias control line (not shown) disposed proximate to SQUID 610, and which threads through the superconducting loop. The flux bias control line feeds a current (e.g., DC current) into an inductor element (not shown) placed adjacent to the superconducting loop of SQUID 610, which causes an external magnetic field $\Phi_{ext}$ to be applied to the superconducting loop of SQUID 610. The external magnetic field $\Phi_{ext}$ can modulate the critical current $I_{CS}$, and thus, the Josephson energy $E_{JS}$ of the SQUID 610.

Flux tuning of TCQ 190 can control the exchange interaction (e.g., facilitate exchange interaction or suppress crosstalk) between qubits 130A-n that are capacitively coupled to the A mode and B mode, respectively, of the TCQ 190. In particular, as schematically illustrated in FIG. 6, connection of respective coupling capacitors 420E-G to nodes N1, N2, N3 enable coupling of respective qubits 130A-n to the TCQ 190 via A mode and B mode. The coupling capacitors 420E-G can be implemented by direct capacitive coupling (via gap capacitance) or by superconducting planar transmission lines, such as coplanar wave-guides.

Referring once again to FIG. 3, quantum system 300 is presented comprising the respective components/devices as mentioned in any of FIGS. 1, 2, 4, 5, and 6. As shown, first qubit 130A (e.g., a transmon qubit) is connected/coupled to the second qubit 130B (e.g., a transmon qubit), with coupling being provided by the first inductor loop 120 and the second inductor loop 160, and a spiral resonator 140, e.g., to electrically cross the gap from the first IC 110 to the second IC 150. As further shown, the first inductor loop 120, spiral resonator 140, first qubit 130A, and the flux-tunable TCQ coupler 190 are located on the first surface 115 of IC 110. Further, the second inductor loop 160 and second qubit 130B are located on the second surface 155 of second IC 150.

As mentioned, the flux-tunable TCQ 190 is configured/utilized to control the coupling between the respective components located on the first IC 110 and the second IC 150. As shown in the embodiment presented in FIG. 3, the TCQ coupler 190 is connected to the first qubit 130A via a set/pair of coupling capacitors 420H and 420I. As further shown, the middle pad 510B of the TCQ coupler 190 is coupled to the first inductor loop 120 via a coupling capacitor 420J. Qubit 130A can be connected differentially to the TCQ 190 with equal coupling capacitance to the pad 510A and pad 510C of the TCQ 190. As mentioned, the spiral resonator 140 can have a unique role in increasing the transmission between the first inductor loop 120 and the second inductor loop 160, with tuning performed by the TCQ 190. The second inductor loop 160 can be connected to the top pad 430C of the qubit 130B via a coupling capacitor 420K.

TCQ 190 can be tuned to operate in a first state (e.g., "OFF" state or "deactivated" state) or a second state (e.g., "ON" state or "activated" state) by changing an amount of external magnetic flux that is applied to the superconducting loop of SQUID 610 to adjust critical current $I_{CS}$ and, thus, adjust the Josephson energy $E_{JS}$ of the SQUID 610. For example, TCQ 190 can be tuned to operate in a "OFF" state by applying an amount of external magnetic flux to the superconducting loop of the SQUID 610 to make the critical current $I_{CS}$ of the SQUID 610 to be equal to, or substantially equal to, the critical current $I_{C1}$ of the Josephson junction 410B, which causes a balance in the respective Josephson energies $E_{J1}$ and $E_{JS}$ of the Josephson junction 410B and the SQUID 610.

In the "OFF" state, TCQ 190 enforces a mode-selective coupling and creates a condition of essentially zero interaction between qubits 130A and 130B that are capacitively coupled to the respective A and B modes. More specifically, in the "OFF" state of the TCQ 190, a qubit (e.g., qubit 130A) which is capacitively coupled to the nodes N1 and N2 of TCQ 190 is exchanged coupled to only the A mode of the TCQ 190, and a qubit (e.g., qubit 130B) superconducting qubit which is capacitively coupled to the node N3 of TCQ 190 is exchanged coupled to only the B mode of the TCQ 190. In the "OFF" state of TCQ 190, the A and B modes have distinct and separate charge patterns such as shown in FIG. 5C, which results in minimal ZZ interaction between the qubits 130A-n that are coupled by the TCQ 190, further suppressing crosstalk (e.g., static ZZ interaction).

Alternatively, TCQ 190 can be tuned to operate in an "ON" state by applying an amount of external magnetic flux to the superconducting loop of the SQUID 610 to cause the critical current $I_{CS}$ of the SQUID 610 to be unequal to (e.g., greater than) the critical current $I_{C1}$ of the Josephson junction 410B, causing an imbalance in the respective Josephson energies $E_{J1}$ and $E_{JS}$ of the Josephson junction 410B and SQUID 610. The imbalance in the Josephson energies $E_{J1}$ and $E_{JS}$ modifies the distinct charge patterns of the A and B modes in such a way as to cause the charge patterns to become linear combinations of the distinct charge patterns shown in FIG. 5C, which disrupts the mode-selective coupling of the TCQ 190, causing the qubits 130A-n to have exchange coupling to both the A mode and the B mode of the TCQ 190. In the "ON" state of the TCQ 190, exchange coupling of both qubits 130A and 130B to both the A mode and the B mode results in exchange coupling (e.g., ZZ interaction) between the qubits 130A and 130B that are capacitively coupled to the A and B modes of the TCQ 190.

Figures 7A, 7B:
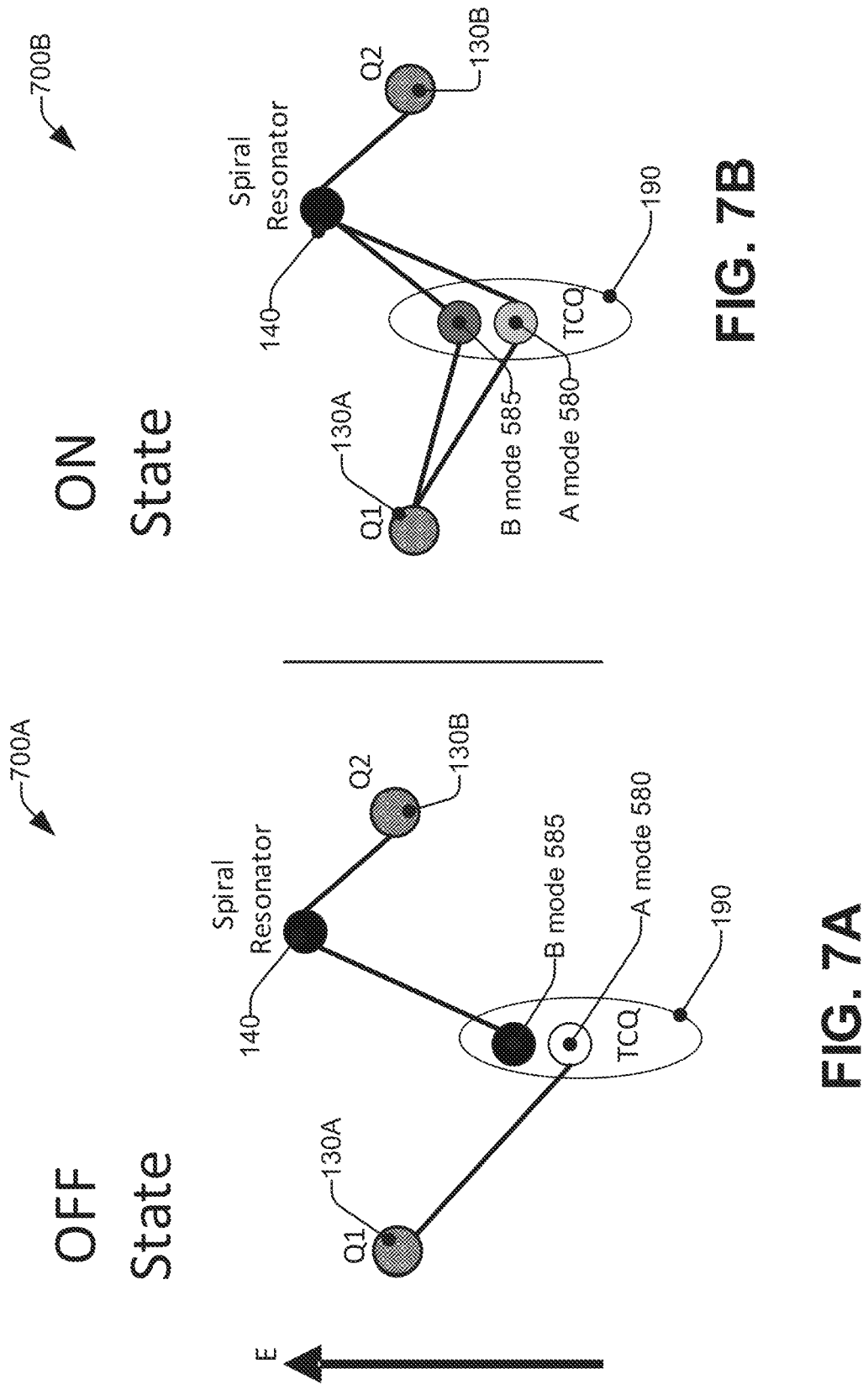
FIGS. 7A and 7B presents schematics illustrate controlling interaction between qubits, in accordance with an embodiment.

FIGS. 7A and 7B, schematics 700A and 700B, illustrate controlling interaction between qubits, in accordance with an embodiment. As shown in FIG. 7A, with TCQ 190 in the OFF state, qubit 130A is in A mode 580 operation (depicted in white), while qubit 130B is in B mode 585 operation (depicted in black), such that the qubits 130A and 130B are not coupled. Alternatively, as shown in FIG. 7B, with operation of TCQ 190 adjusted to be in the ON state, qubits 130A and 130B can both have coupling via the A mode 580 and B mode 585 of the TCQ 190 operation (respectively depicted in grey and black to illustrate interaction).

Turning to FIGS. 8-11, charts 800-1100 present respective effects of applying a spiral resonator to engender coupling between qubits in a quantum computer system, in accordance with one or more embodiments.

Figure 8:
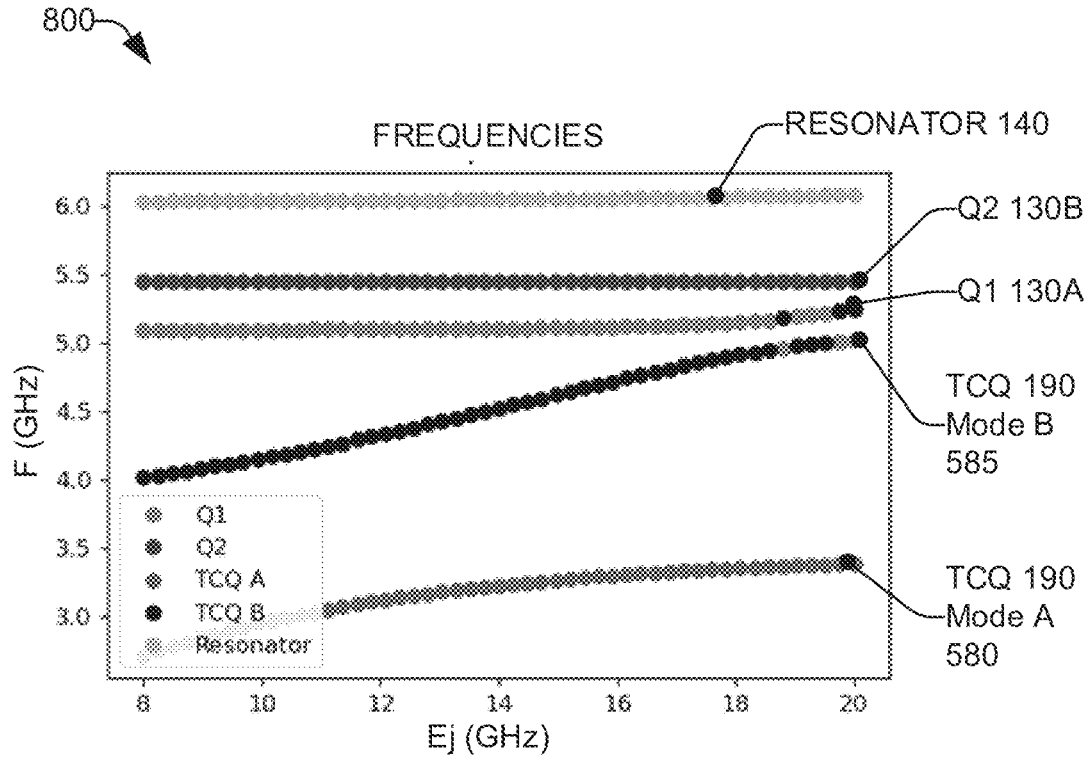
FIGS. 8-11 presents respective charts illustrating respective effects of applying a spiral resonator to engender coupling between qubits are presented, in accordance with one or more embodiments.

FIG. 8 presents the respective frequencies of operation of the first qubit 130A, second qubit 130B, mode A operation of the TCQ 190, mode B operation of the TCQ 190, and the spiral resonator 140. As shown in the example embodiment, the spiral resonator 140 is operated with a consistent frequency (e.g., natural resonant frequency) of approximately 6.0 GHz. As the Josephson (Ej) frequency of the SQUID 610 is increased, the energy of mode B 585 of the TCQ 190 is increased to almost being in resonance with the frequency of the lower frequency qubit 130A.

Figure 9:
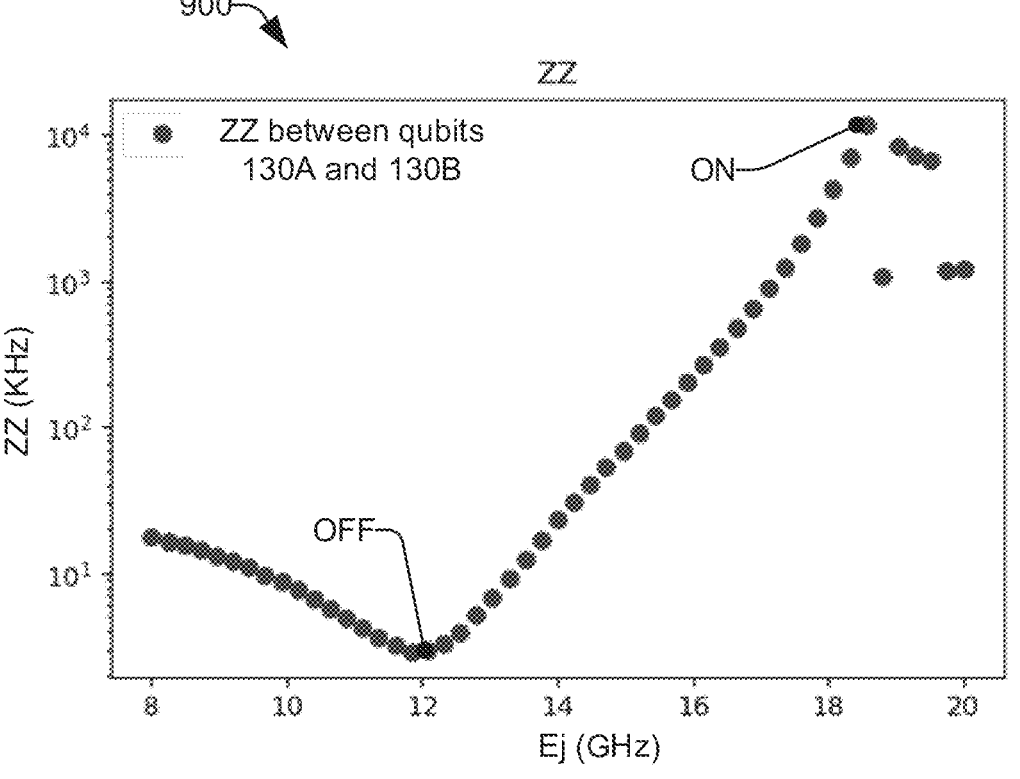

As shown in FIG. 9, with the Josephson (Ej) frequency of approximately 12 GHz, the ZZ interaction between qubits 130A and 130B is low to the point of essentially being zero. However, as the Josephson (Ej) frequency is increased to approximately 18 GHZ, the ZZ interaction between qubits 130A and 130B is at $1 \times 10^4$ kHz (e.g., >10 MHZ) which is sufficiently fast for operation of a two qubit gate. As shown, the ON state (Ej=18 GHZ) has a ZZ frequency ($1 \times 10^4$ KHz) with a magnitude more than three magnitudes higher than the ZZ frequency (~3 KHz) of the OFF state (Ej=12 GHZ).

Figure 10:
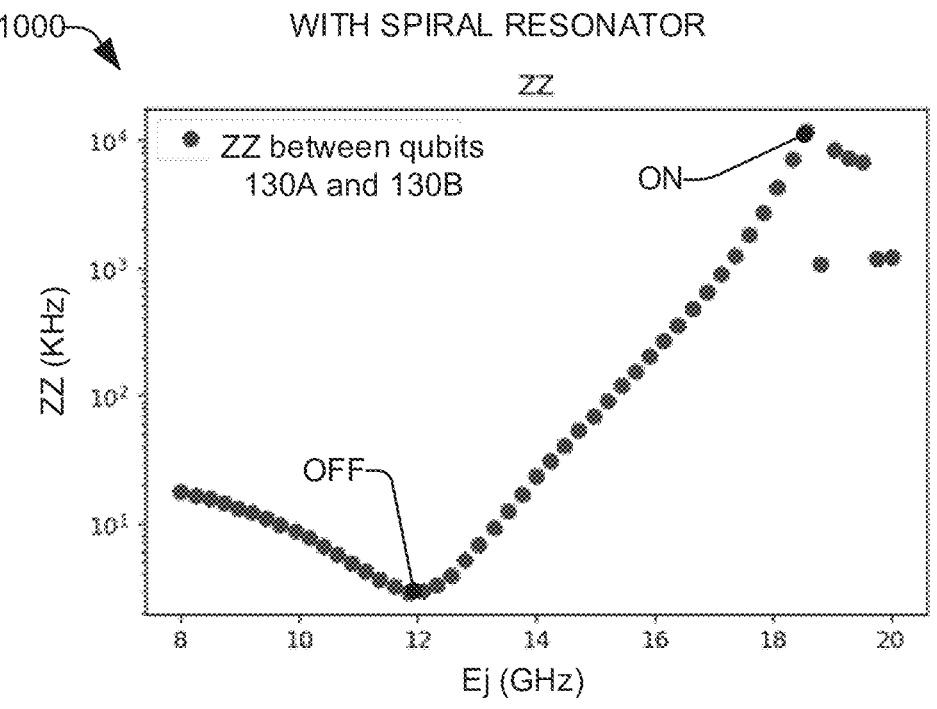
Figure 11:
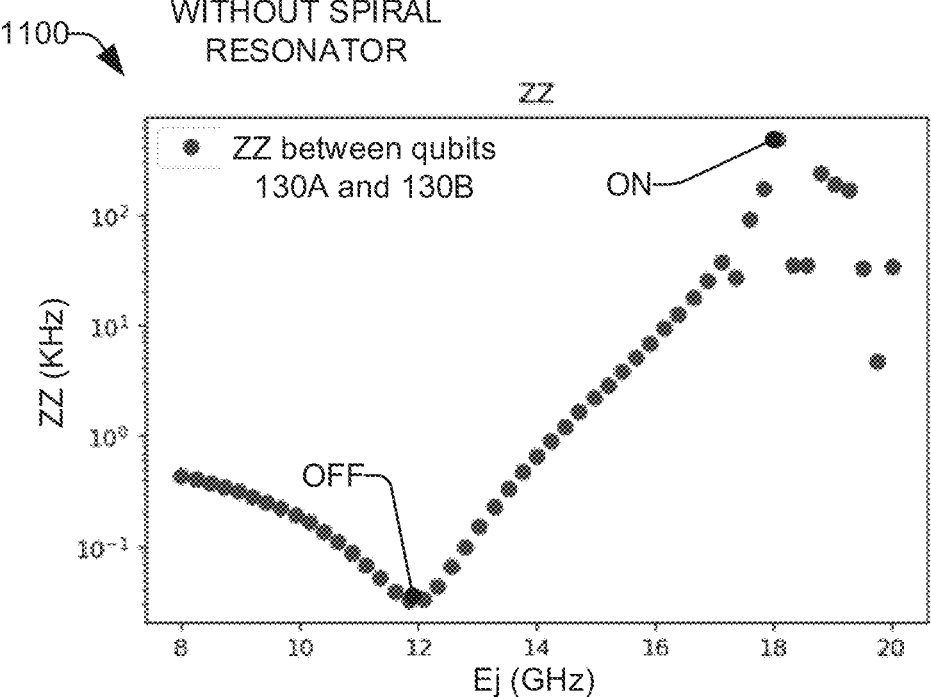

Turning to FIGS. 10 and 11, charts 1000 and 1100 respectively show the effect of operating with the spiral resonator 140 (chart 1000) and without the spiral resonator 140 (chart 1100). As shown in FIG. 10, with the spiral resonator 140 being utilized and TCQ 190 is in an ON state, the ZZ interaction between qubits 130A and 130B is $1 \times 10^4$ kHz. Per FIG. 11, for system 300 when not utilizing the spiral resonator 140 but with TCQ 190 in an ON state, the ZZ interaction between qubits 130A and 130B is $1 \times 10^2$ kHz. Accordingly, utilizing the spiral resonator 140 shows a 100-fold improvement in ZZ interaction between qubits 130A and 130B.

Figure 12:
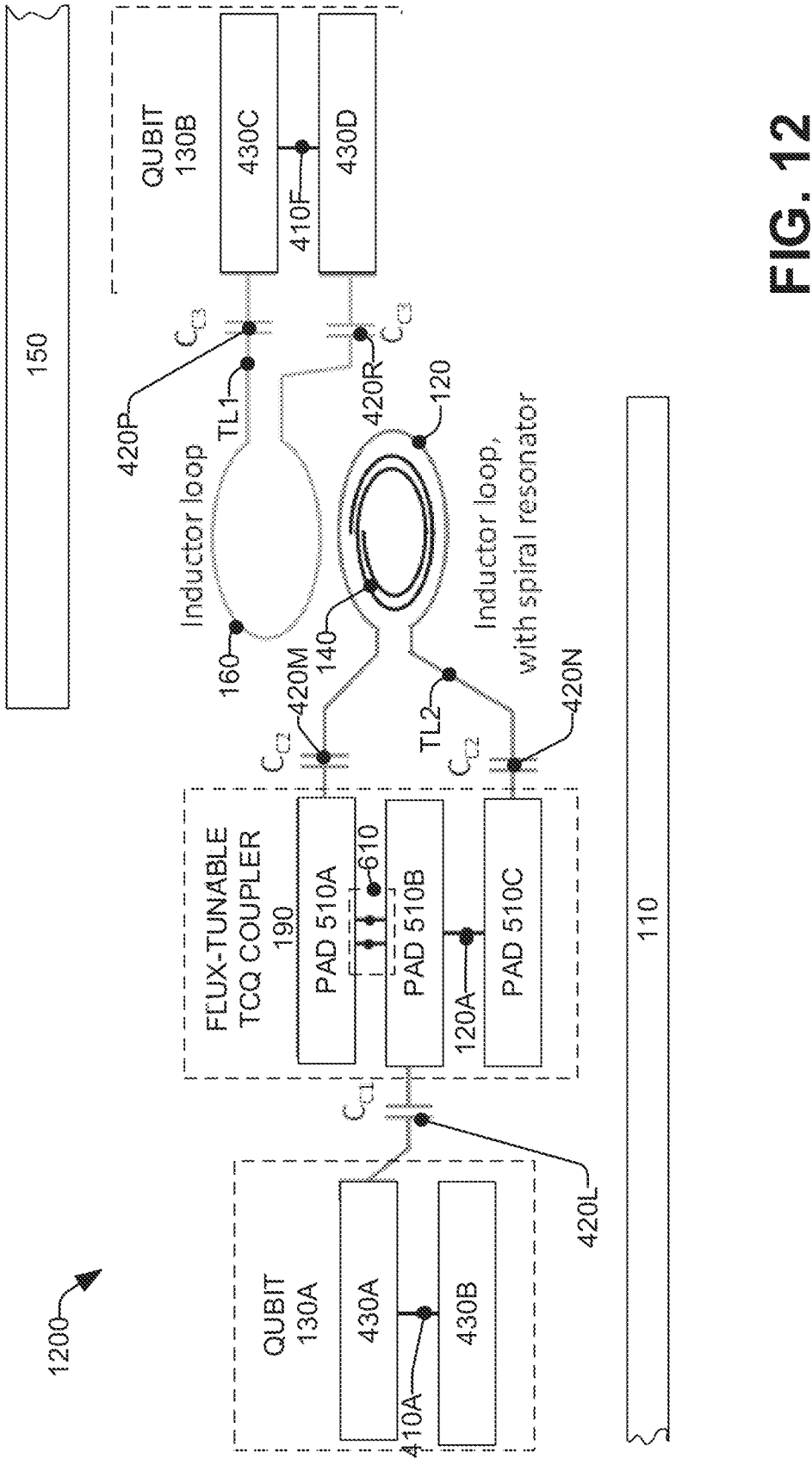
FIG. 12 presents a schematic illustrating a system to facilitate coupling between qubits in a quantum computer system, in accordance with an embodiment.

Turning to FIG. 12, quantum system 1200 is presented comprising the respective components/devices as mentioned in any of FIGS. 1, 2, 4, 5, and 6. System 1200 presents an alternative arrangement to that presented in system 300. As shown, first qubit 130A (e.g., a transmon qubit) is connected/coupled to the second qubit 130B (e.g., a transmon qubit), with coupling being provided by the first inductor loop 120 and the second inductor loop 160 operating in conjunction with a spiral resonator 140, e.g., to electrically cross the gap from the first IC 110 to the second IC 150. As further shown, the first inductor loop 120, spiral resonator 140, first qubit 130A, and the flux-tunable TCQ coupler 190 are located on the first surface 115 of first IC 110. Further, the second inductor loop 160 and second qubit 130B are located on the second surface 155 of second IC 150.

As previously mentioned, the flux-tunable TCQ 190 is configured/utilized to control the coupling between the respective components located on the first IC 110 and the second IC 150. As shown in the embodiment presented in FIG. 12, the TCQ coupler 190 is connected to the first qubit 130A via a coupling capacitor 420L connected to middle pad 510B of the TCQ 190, creating selective coupling of qubit 130A to the B mode 585 of the TCQ 190 when TCQ 190 is in the OFF state. As further shown, the top pad 510A and the bottom pad 510C of the TCQ coupler 190 are respectively coupled to the first inductor loop 120 via coupling capacitors 420M and 420N. Inductor loop 120 can be differentially coupled to the TCQ 190 with equal coupling capacitance to the pad 510A and pad 510C of the TCQ 190, creating selective coupling of A mode 580 of the TCQ 190 to the spiral resonator 140. As mentioned, the spiral resonator 140 can have a unique role in increasing the transmission between the first inductor loop 120 and the second inductor loop 160, with tuning performed by the TCQ 190. In further comparison with the system 300 presented in FIG. 3, the second qubit 130B can be connected to the second inductor loop 160 via top and bottom pads 430C and 430D and capacitors 420P and 420R. An advantage of the system 1200, e.g., as a function of the moved coupling capacitors 420L, 420M, and 420N, and further coupling capacitors 420P and 420R is the system 1200 can take advantage of the differential/transmission lines (e.g., TL1 and TL2) between the inductor loops 120 and 160 and the rest of the system 1200. In an embodiment, the differential/transmission lines can be physically long, and if made differential rather than single ended, the arrangement of system 1200 can help to reduce coupling of the system 1200 to external noise or other parasitic modes that may be present at a qubit array (e.g., qubit arrays 115A and 115B) and/or a quantum computer system.

Figure 13:
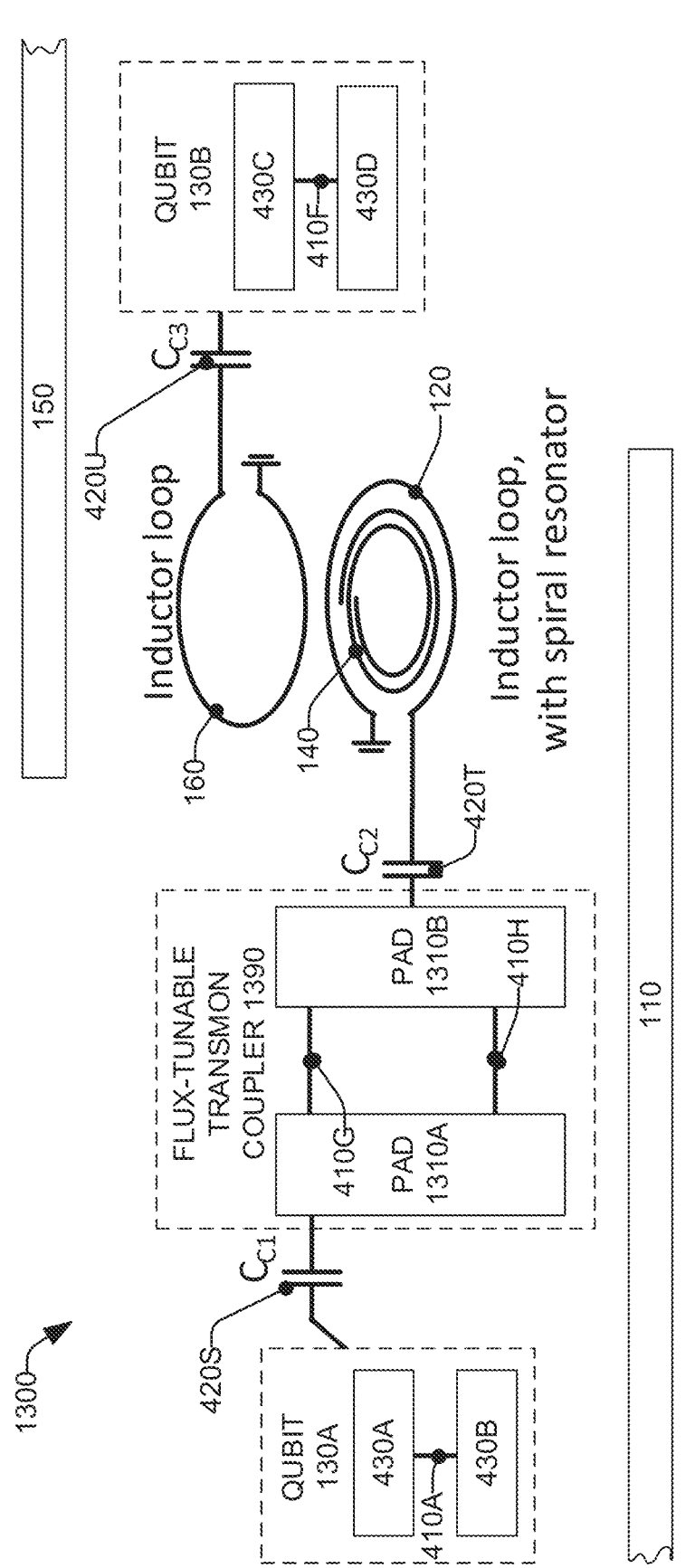
FIG. 13 presents a schematic illustrating a quantum computing device to facilitate coupling between qubits in a quantum computer system, in accordance with an embodiment.

FIG. 13, system 1300, presents a schematic illustrating a quantum computing device to facilitate coupling between qubits in a quantum computer system, in accordance with an embodiment. FIG. 13 presents the respective components/devices as mentioned in any of FIGS. 1, 2, 4, 5, and 6, however, here the TCQ 190 has been replaced by a flux-tunable transmon coupler 1390. The flux-tunable transmon coupler 1390 can comprise of a first pad 1310A and a second pad 1310B connected by a first Josephson junction 410G and a second Josephson junction 410H. The flux-tunable transmon coupler 1390 can operate based on cancellation, taking advantage of direct and indirect coupling between qubits 130A and 130B, with ON/OFF coupling provided by the flux-tunable transmon coupler 1390. As shown, the first pad 1310A of the flux-tunable transmon coupler 1390 can be connected to the qubit 130A via the capacitor 420S and further, the pad 1310B of the flux-tunable transmon coupler 1390 can be coupled to the inductor loop 120 via capacitor 420T. Further, the inductor loop 160 can be coupled to qubit 130B via capacitor 420U. Capacitor 420S can have a capacitance $C_{C1}$, capacitor 420T can have a capacitance $C_{C2}$, and capacitor 420U can have a capacitance $C_{C3}$. Coupling of qubit 130A to qubit 130B can be via the inductor loops 120 and 160, with coupling enhanced by activation of the spiral resonator 140, and operation ON/OFF state of the coupling being controlled by flux-tuning of the flux-tunable transmon coupler 1290, e.g., in a manner similar to operation of the TCQ 190.

FIG. 14, schematic 1400 illustrate a computer-implemented methodology to enhance coupling between qubits in a quantum computing system.

At 1410, operation of a first inductor loop (e.g., inductor loop 120) and a second inductor loop (e.g., inductor loop 160) can be initiated. In an embodiment, the first inductor loop can be connected to a first qubit (e.g., qubit 130A) and the second inductor loop can be connected to a second qubit (e.g., qubit 130). As previously mentioned, coupling between the first inductor loop and the second inductor loop can enable coupling/entanglement between the first qubit and the second qubit. To enable operational adjustment of the operation of the first inductor loop, and ultimately between the first qubit and the second qubit, a flux-tunable TCQ coupler (e.g., TCQ 190) can be incorporated between the first qubit and the first inductor loop. The TCQ coupler can include a SQUID (e.g., SQUID 610) and a Josephson junction (e.g., Josephson junction 410B). As previously described, by altering magnetic flux present at the SQUID, operation of the TCQ coupler can be adjusted.

At 1420, a spiral resonator (e.g., spiral resonator 140) can be located within the first loop inductor. When energized, the spiral resonator can couple with the first loop inductor and the second loop inductor. Operation of the spiral resonator at a given resonant frequency (e.g., approximately 6 GHZ, a value between 5.5 GHZ and 6.5 GHZ, and suchlike) can enhance the magnitude of coupling between the first loop inductor and the second loop inductor.

At 1430, with the spiral resonator energized, the flux applied to the TCQ coupler can be adjusted to transition/alternate operation of the first loop inductor from being in an OFF state (e.g., A mode 580 operation) to an ON state (e.g., B mode 585 operation). Accordingly, coupling between the first qubit and second qubit can occur, with the coupling strength enhanced by operation of the spiral resonator.

FIG. 15, schematic 1500 illustrate a computer-implemented methodology to enhance coupling between qubits in a quantum computing system.

At 1510, a first IC (e.g., IC 110) can be fabricated with a first qubit (e.g., qubit 130A) connected to a first inductor loop (e.g., inductor loop 120). A flux-tunable device (e.g., a TCQ 190, transmon coupler 1390) can be position between and coupled to the first qubit and the first inductor loop. The flux-tunable device can be configured to control operation of the first inductor loop.

At 1520, a second IC (e.g., IC 150) can be fabricated with a second qubit (e.g., qubit 130B) connected to a second inductor loop (e.g., inductor loop 160). The first IC and the second IC can be combined in a qubit array (e.g., array 1640).

At 1530, a spiral resonator (e.g., spiral resonator 140) can be fabricated/located inside the loop of the first inductor loop.

At 1540, the first inductor loop can be energized to couple the first inductor loop to the second inductor loop.

At 1550, the spiral resonator can be energized to enhance coupling between the first inductor loop and the second inductor loop.

At 1560, owing to coupling between the first inductor loop and the second inductor loop, as enhanced by the spiral resonator, the first qubit is coupled to the second qubit.

Figure 16:
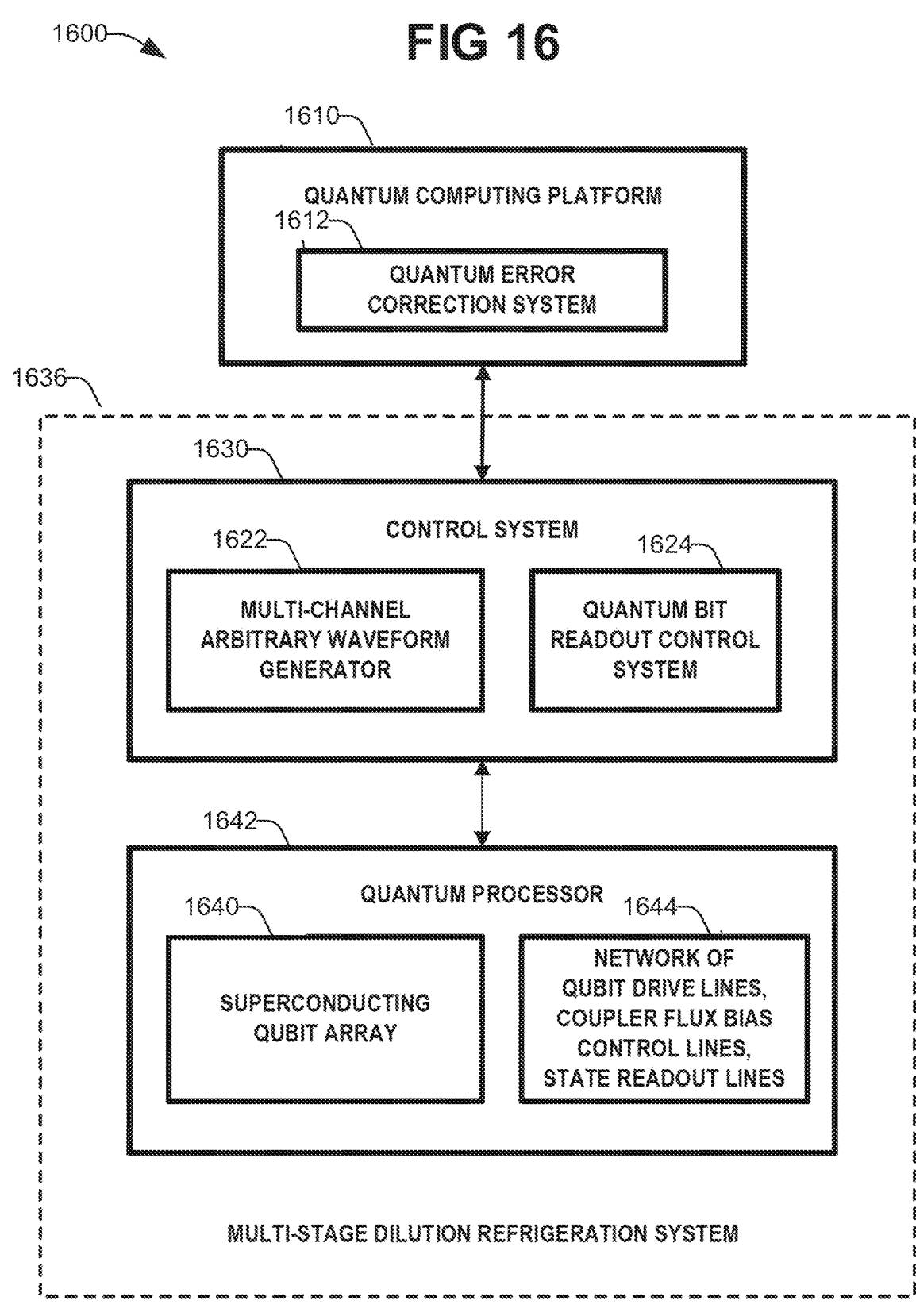
FIG. 16, presents a quantum computing system, according to at least one embodiment.

FIG. 16, presents a quantum computing system 1600, according to at least one embodiment. FIG. 16 schematically illustrates the quantum computing system 1600 which comprises a quantum computing platform 1610, a control system 1630, and a quantum processor 1642. In various embodiments, the quantum computing platform 1610 implements software control programs such as a software-based quantum error correction system 1612 to perform a quantum error correction processes, application of source code, etc., as well as perform other software-controlled processes such as qubit calibration operations. In other embodiments, the control system 1630 comprises a multi-channel arbitrary waveform generator 1622, and a quantum bit readout control system 1624. A quantum processor 1642 can comprise one or more solid-state semiconductor chips having one or more qubit arrays 1640 (e.g., qubit arrays 115A and 115B) located thereon, and further a network 1644 of qubit drive lines, coupler flux-bias control lines, and qubit state readout lines, and other circuit QED components that may be needed for a given application or quantum system configuration.

In various embodiments, the control system 1630 and the quantum processor 1642 are disposed in a dilution refrigeration system 1636 which can generate cryogenic temperatures that are sufficient to operate components of the control system 1630 for quantum computing applications. For example, the quantum processor 1642 may need to be cooled down to near-absolute zero, e.g., 10-15 millikelvin (mK), to allow the superconducting qubits to exhibit quantum behaviors. In some embodiments, the dilution refrigeration system 1636 comprises a multi-stage dilution refrigerator where the components of the control system 1630 can be maintained at different cryogenic temperatures, as needed. For example, while the quantum processor 1642 may need to be cooled down to, e.g., 10-15 mK, the circuit components of the control system 1630 may be operated at cryogenic temperatures greater than 10-15 mK (e.g., cryogenic temperatures in a range of 3K-4K), depending on the configuration of the quantum computing system.

In other embodiments, the qubit array 1640 comprises a quantum system of data/auxiliary qubits (e.g., qubits 130A and 130B), and qubit couplers (e.g., TCQ 190, SMQ 190A). The number of qubits of the qubit array 1640 can be on the order of tens, hundreds, thousands, or more, etc. The network 1644 of qubit drive lines, coupler flux bias control lines, and qubit state readout lines, etc., are configured to apply microwave control signals to qubits and coupler circuitry in the qubit array 1640 to perform various types of gate operations, e.g., single-gate operations, entanglement gate operations (e.g., CPHASE gate operation), perform error correction operations, etc., as well read the quantum states of the qubits. For example, as noted above, microwave control pulses are applied to the qubit drive lines of respective qubits to change the quantum state of the qubits (e.g., change the quantum state of a given qubit between the ground state and excited state, or to a superposition state) when executing quantum information processing algorithms.

Furthermore, as noted above, the state readout lines comprise readout resonators that are coupled to respective qubits. The state of a given qubit can be determined through microwave transmission measurements made between readout ports of the readout resonator. The states of the qubits are read out after executing a quantum algorithm. In some embodiments, a dispersive readout operation is performed in which a change in the resonant frequency of a given readout resonator, which is coupled to a given qubit, is utilized to readout the state (e.g., ground or excited state) of the given qubit.

The network 1644 of qubit drive lines, coupler flux bias control lines, and qubit state readout lines, etc., is coupled to the control system 1630 through a suitable hardware input/ output (I/O) interface, which couples I/O signals between the control system 1630 and the quantum processor 1642. For example, the hardware I/O interface may comprise various types of hardware and components, such as RF cables, wiring, RF elements, optical fibers, heat exchanges, filters, amplifiers, isolators, etc.

In some embodiments, the multi-channel arbitrary waveform generator (AWG) 1622 and other suitable microwave pulse signal generators are configured to generate the microwave control pulses that are applied to the qubit drive lines, and the coupler drive lines to control the operation of the superconducting qubits and associated qubit coupler circuitry, when performing various gate operations to execute a given certain quantum information processing algorithm. In some embodiments, the multi-channel AWG 1622 comprises a plurality of AWG channels, which control respective superconducting qubits within the superconducting qubit array 1640 of the quantum processor 1642. In some embodiments, each AWG channel comprises a baseband signal generator, a digital-to-analog converter (DAC) stage, a filter generator, a digital-to-analog converter (DAC) stage, a filter stage, a modulation stage, an impedance matching network, and a phase-locked loop system to generate local oscillator (LO) signals (e.g., quadrature LO signals LO_I and LO_Q) for the respective modulation stages of the respective AWG channels.

In some embodiments, the multi-channel AWG 1622 comprises a quadrature AWG system which is configured to process quadrature signals, wherein a quadrature signal comprises an in-phase (I) signal component, and a quadrature-phase (Q) signal component. In each AWG channel the baseband signal generator is configured to receive baseband data as input (e.g., from the quantum computing platform), and generate digital quadrature signals I and Q which represent the input baseband data. In this process, the baseband data that is input to the baseband signal generator for a given AWG channel is separated into two orthogonal digital components including an in-phase (I) baseband component and a quadrature-phase (Q) baseband component. The baseband signal generator for the given AWG channel can generate the requisite digital quadrature baseband IQ signals which are needed to generate an analog waveform (e.g., sinusoidal voltage waveform) with a target center frequency that is configured to operate or otherwise control a given quantum bit that is coupled to the output of the given AWG channel.

The DAC stage for the given AWG channel is configured to convert a digital baseband signal (e.g., a digital IQ signal output from the baseband signal generator) to an analog baseband signal (e.g., analog baseband signals I(t) and Q(t)) having a baseband frequency. The filter stage for the given AWG channel is configured to filter the IQ analog signal components output from the DAC stage to thereby generate filtered analog IQ signals. The modulation stage for the given AWG channel is configured to perform analog IQ signal modulation (e.g., single-sideband (SSB) modulation) by mixing the filtered analog signals I(t) and Q(t), which are output from the filter stage, with quadrature LO signals (e.g., an in-phase LO signal (LO_I) and a quadrature-phase LO signal (LO_Q)) to generate and output an analog RF signal (e.g., a single-sideband modulated RF output signal).

In some embodiments, the quantum bit readout control system 1624 comprises a microwave pulse signal generator that is configured to apply a microwave tone to a given readout resonator line of a given qubit to perform a readout operation to readout the state of the given qubit, as well as circuitry that is configured to process the readout signal generated by the readout resonator line to determine the state of the given qubit, using techniques known to those of ordinary skill in the art.

The quantum computing platform 1610 comprises a software and hardware platform which comprises various software layers that are configured to perform various functions, including, but not limited to, generating and implementing various quantum applications using suitable quantum programming languages, configuring and implementing various quantum gate operations, compiling quantum programs into a quantum assembly language, implementing and utilizing a suitable quantum instruction set architecture (ISA), performing calibration operations to calibrate the quantum circuit elements and gate operations, etc. In addition, the quantum computing platform 1610 comprises a hardware architecture of processors, memory, etc., which is configured to control the execution of quantum applications, and interface with the control system 1630 to (i) generate digital control signals that are converted to analog microwave control signals by the control system 1630, to control operations of the quantum processor 1642 when executing a given quantum application, and (ii) to obtain and process digital signals received from the control system 1630, which represent the processing results generated by the quantum processor 1642 when executing various gate operations for a given quantum application.

In some exemplary embodiments, the quantum computing platform 1610 of the quantum computing system 1600 may be implemented using any suitable computing system architecture which is configured to implement methods to support quantum computing operations by executing computer readable program instructions that are embodied on a computer program product which includes a computer readable storage medium (or media) having such computer readable program instructions thereon for causing a processor to perform control methods as discussed herein.

The quantum computing platform 1610 comprises a software and hardware platform which comprises various software layers that are configured to perform various functions, including, but not limited to, generating and implementing various quantum applications using suitable quantum programming languages, configuring and implementing various quantum gate operations, compiling quantum programs into a quantum assembly language, implementing and utilizing a suitable quantum instruction set architecture (ISA), performing calibration operations to calibrate the quantum circuit elements and gate operations, etc. In addition, the quantum computing platform 1610 comprises a hardware architecture of processors, memory, etc., which is configured to control the execution of quantum applications, and interface with the control system 1630 to (i) generate digital control signals that are converted to analog microwave control signals by the control system 1630, to control operations of the quantum processor 1642 when executing a given quantum application, and (ii) to obtain and process digital signals received from the control system 1630, which represent the processing results generated by the quantum processor 1642 when executing various gate operations for a given quantum application. In some exemplary embodiments, the quantum computing platform 1610 of the quantum computing system 1600 may be implemented using any suitable computing system architecture which is configured to implement methods to support quantum computing operations by executing computer readable program instructions that are embodied on a computer program product which includes a computer readable storage medium (or media) having such computer readable program instructions thereon for causing a processor to perform control methods as discussed herein.

EXAMPLE APPLICATIONS AND USE

FIG. 17 and the following discussion are intended to provide a brief, general description of a suitable computing environment 1700 in which one or more embodiments described herein at FIGS. 1-16 can be implemented. For example, various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks can be performed in reverse order, as a single integrated step, concurrently or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium can be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include diskette, hard disk, random access memory (RAM), read-only memory (ROM), erasable programmable read-only memory (EPROM or Flash memory), static random-access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Computing environment 1700 contains an example of an environment for the execution of at least some of computer code 1780 involved in performing the inventive methods, such as controlling operation of a spiral resonator (e.g., spiral resonator 140) and inductor loops (e.g., loops 120 and 160) to enhance coupling between qubits (e.g., qubits 130A and 130B). In addition to block 1780, computing environment 1700 includes, for example, computer 1701, wide area network (WAN) 1702, end user device (EUD) 1703, remote server 1704, public cloud 1705, and private cloud 1706. In this embodiment, computer 1701 includes processor set 1710 (including processing circuitry 1720 and cache 1721), communication fabric 1711, volatile memory 1712, persistent storage 1713 (including operating system 1722 and block 1780, as identified above), peripheral device set 1714 (including user interface (UI), device set 1723, storage 1724, and Internet of Things (IoT) sensor set 1725), and network module 1715. Remote server 1704 includes remote database 1730. Public cloud 1705 includes gateway 1740, cloud orchestration module 1741, host physical machine set 1742, virtual machine set 1743, and container set 1744.

COMPUTER 1701 can take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 1730. As is well understood in the art of computer technology, and depending upon the technology, performance of a computer-implemented method can be distributed among multiple computers and/or between multiple locations. On the other hand, in this presentation of computing environment 1700, detailed discussion is focused on a single computer, specifically computer 1701, to keep the presentation as simple as possible. Computer 1701 can be located in a cloud, even though it is not shown in a cloud in FIG. 17. On the other hand, computer 1701 is not required to be in a cloud except to any extent as can be affirmatively indicated.

PROCESSOR SET 1710 includes one, or more, computer processors of any type now known or to be developed in the future. Processing circuitry 1720 can be distributed over multiple packages, for example, multiple, coordinated integrated circuit chips. Processing circuitry 1720 can implement multiple processor threads and/or multiple processor cores. Cache 1721 is memory that is located in the processor chip package(s) and is typically used for data or code that should be available for rapid access by the threads or cores running on processor set 1710. Cache memories are typically organized into multiple levels depending upon relative proximity to the processing circuitry. Alternatively, some, or all, of the cache for the processor set can be located "off chip." In some computing environments, processor set 1710 can be designed for working with qubits and performing quantum computing.

Computer readable program instructions are typically loaded onto computer 1701 to cause a series of operational steps to be performed by processor set 1710 of computer 1701 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 1721 and the other storage media discussed below. The program instructions, and associated data, are accessed by processor set 1710 to control and direct performance of the inventive methods. In computing environment 1700, at least some of the instructions for performing the inventive methods can be stored in block 1780 in persistent storage 1713.

COMMUNICATION FABRIC 1711 is the signal conduction path that allows the various components of computer 1701 to communicate with each other. Typically, this fabric is made of switches and electrically conductive paths, such as the switches and electrically conductive paths that make up busses, bridges, physical input/output ports and the like. Other types of signal communication paths can be used, such as fiber optic communication paths and/or wireless communication paths.

VOLATILE MEMORY 1712 is any type of volatile memory now known or to be developed in the future. Examples include dynamic type random access memory (RAM) or static type RAM. Typically, the volatile memory is characterized by random access, but this is not required unless affirmatively indicated. In computer 1701, the volatile memory 1712 is located in a single package and is internal to computer 1701, but, alternatively or additionally, the volatile memory can be distributed over multiple packages and/or located externally with respect to computer 1701.

PERSISTENT STORAGE 1713 is any form of nonvolatile storage for computers that is now known or to be developed in the future. The non-volatility of this storage means that the stored data is maintained regardless of whether power is being supplied to computer 1701 and/or directly to persistent storage 1713. Persistent storage 1713 can be a read only memory (ROM), but, typically at least a portion of the persistent storage allows writing of data, deletion of data and re-writing of data. Some familiar forms of persistent storage include magnetic disks and solid-state storage devices. Operating system 1722 can take several forms, such as various known proprietary operating systems or open-source Portable Operating System Interface type operating systems that employ a kernel. The code included in block 1780 typically includes at least some of the computer code involved in performing the inventive methods.

PERIPHERAL DEVICE SET 1714 includes the set of peripheral devices of computer 1701. Data communication connections between the peripheral devices and the other components of computer 1701 can be implemented in various ways, such as Bluetooth connections, Near-Field Communication (NFC) connections, connections made by cables (such as universal serial bus (USB) type cables), insertion type connections (for example, secure digital (SD) card), connections made though local area communication networks and even connections made through wide area networks such as the internet. In various embodiments, UI device set 1723 can include components such as a display screen, speaker, microphone, wearable devices (such as goggles and smart watches), keyboard, mouse, printer, touchpad, game controllers, and haptic devices. Storage 1724 is external storage, such as an external hard drive, or insertable storage, such as an SD card. Storage 1724 can be persistent and/or volatile. In some embodiments, storage 1724 can take the form of a quantum computing storage device for storing data in the form of qubits. In embodiments where computer 1701 is required to have a large amount of storage (for example, where computer 1701 locally stores and manages a large database) then this storage can be provided by peripheral storage devices designed for storing large amounts of data, such as a storage area network (SAN) that is shared by multiple, geographically distributed computers. IoT sensor set 1725 is made up of sensors that can be used in Internet of Things applications. For example, one sensor can be a thermometer and another sensor can be a motion detector.

NETWORK MODULE 1715 is the collection of computer software, hardware, and firmware that allows computer 1701 to communicate with other computers through WAN 1702. Network module 1715 can include hardware, such as modems or Wi-Fi signal transceivers, software for packetizing and/or de-packetizing data for communication network transmission, and/or web browser software for communicating data over the internet. In some embodiments, network control functions and network forwarding functions of network module 1715 are performed on the same physical hardware device. In other embodiments (for example, embodiments that utilize software-defined networking (SDN)), the control functions and the forwarding functions of network module 1715 are performed on physically separate devices, such that the control functions manage several different network hardware devices. Computer readable program instructions for performing the inventive methods can typically be downloaded to computer 1701 from an external computer or external storage device through a network adapter card or network interface included in network module 1715.

WAN 1702 is any wide area network (for example, the internet) capable of communicating computer data over non-local distances by any technology for communicating computer data, now known or to be developed in the future. In some embodiments, the WAN can be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

END USER DEVICE (EUD) 1703 is any computer system that is used and controlled by an end user (for example, a customer of an enterprise that operates computer 1701) and can take any of the forms discussed above in connection with computer 1701. EUD 1703 typically receives helpful and useful data from the operations of computer 1701. For example, in a hypothetical case where computer 1701 is designed to provide a recommendation to an end user, this recommendation would typically be communicated from network module 1715 of computer 1701 through WAN 1702 to EUD 1703. In this way, EUD 1703 can display, or otherwise present, the recommendation to an end user. In some embodiments, EUD 1703 can be a client device, such as thin client, heavy client, mainframe computer and/or desktop computer.

REMOTE SERVER 1704 is any computer system that serves at least some data and/or functionality to computer 1701. Remote server 1704 can be controlled and used by the same entity that operates computer 1701. Remote server 1704 represents the machine(s) that collect and store helpful and useful data for use by other computers, such as computer 1701. For example, in a hypothetical case where computer 1701 is designed and programmed to provide a recommendation based on historical data, then this historical data can be provided to computer 1701 from remote database 1730 of remote server 1704.

PUBLIC CLOUD 1705 is any computer system available for use by multiple entities that provides on-demand availability of computer system resources and/or other computer capabilities, especially data storage (cloud storage) and computing power, without direct active management by the scale. The direct and active management of the computing resources of public cloud 1705 is performed by the computer hardware and/or software of cloud orchestration module 1741. The computing resources provided by public cloud 1705 are typically implemented by virtual computing environments that run on various computers making up the computers of host physical machine set 1742, which is the universe of physical computers in and/or available to public cloud 1705. The virtual computing environments (VCEs) typically take the form of virtual machines from virtual machine set 1743 and/or containers from container set 1744. It is understood that these VCEs can be stored as images and can be transferred among and between the various physical machine hosts, either as images or after instantiation of the VCE. Cloud orchestration module 1741 manages the transfer and storage of images, deploys new instantiations of VCEs and manages active instantiations of VCE deployments. Gateway 1740 is the collection of computer software, hardware and firmware allowing public cloud 1705 to communicate through WAN 1702.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 1706 is similar to public cloud 1705, except that the computing resources are only available for use by a single enterprise. While private cloud 1706 is depicted as being in communication with WAN 1702, in other embodiments a private cloud can be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 1705 and private cloud 1706 are both part of a larger hybrid cloud.

The embodiments described herein can be directed to one or more of a system, a method, an apparatus and/or a computer program product at any possible technical detail level of integration. The computer program product can include a computer readable storage medium (or media) having computer readable program instructions thereon for causing a processor to carry out aspects of the one or more embodiments described herein. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a superconducting storage device and/or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon and/or any suitable combination of the foregoing. A computer readable storage medium, as used herein, is not to be construed as being transitory signals per se, such as radio waves and/or other freely propagating electromagnetic waves, electromagnetic waves propagating through a waveguide and/or other transmission media (e.g., light pulses passing through a fiber-optic cable), and/or electrical signals transmitted through a wire.

Computer readable program instructions described herein can be downloaded to respective computing/processing devices from a computer readable storage medium and/or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the one or more embodiments described herein can be assembler instructions, instruction-set-architecture (ISA) instructions, machine instructions, machine dependent instructions, microcode, firmware instructions, state-setting data, configuration data for integrated circuitry, and/or source code and/or object code written in any combination of one or more programming languages, including an object oriented programming language such as Smalltalk, C++ or the like, and/or procedural programming languages, such as the "C" programming language and/or similar programming languages. The computer readable program instructions can execute entirely on a computer, partly on a computer, as a stand-alone software package, partly on a computer and/or partly on a remote computer or entirely on the remote computer and/or server. In the latter scenario, the remote computer can be connected to a computer through any type of network, including a local area network (LAN) and/or a wide area network (WAN), and/or the connection can be made to an external computer (for example, through the Internet using an Internet Service Provider). In one or more embodiments, electronic circuitry including, for example, programmable logic circuitry, field-programmable gate arrays (FPGA) and/or programmable logic arrays (PLA) can execute the computer readable program instructions by utilizing state information of the computer readable program instructions to personalize the electronic circuitry, in order to perform aspects of the one or more embodiments described herein.

Aspects of the one or more embodiments described herein are described with reference to flowchart illustrations and/or block diagrams of methods, apparatus (systems), and computer program products according to one or more embodiments described herein. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general-purpose computer, special purpose computer and/or other programmable data processing apparatus to produce a machine, such that the instructions, which execute via the processor of the computer or other programmable data processing apparatus, can create means for implementing the functions/acts specified in the flowchart and/or block diagram block or blocks. These computer readable program instructions can also be stored in a computer readable storage medium that can direct a computer, a programmable data processing apparatus and/or other devices to function in a particular manner, such that the computer readable storage medium having instructions stored therein can comprise an article of manufacture including instructions which can implement aspects of the function/act specified in the flowchart and/or block diagram block or blocks. The computer readable program instructions can also be loaded onto a computer, other programmable data processing apparatus and/or other device to cause a series of operational acts to be performed on the computer, other programmable apparatus and/or other device to produce a computer implemented process, such that the instructions which execute on the computer, other programmable apparatus and/or other device implement the functions/acts specified in the flowchart and/or block diagram block or blocks.

The flowcharts and block diagrams in the Figures illustrate the architecture, functionality and/or operation of possible implementations of systems, computer-implementable methods and/or computer program products according to one or more embodiments described herein. In this regard, each block in the flowchart or block diagrams can represent a module, segment and/or portion of instructions, which comprises one or more executable instructions for implementing the specified logical function. In one or more alternative implementations, the functions noted in the blocks can occur out of the order noted in the Figures. For example, two blocks shown in succession can be executed substantially concurrently, and/or the blocks can sometimes be executed in the reverse order, depending upon the functionality involved. It will also be noted that each block of the block diagrams and/or flowchart illustration, and/or combinations of blocks in the block diagrams and/or flowchart illustration, can be implemented by special purpose hardware-based systems that can perform the specified functions and/or acts and/or carry out one or more combinations of special purpose hardware and/or computer instructions.

While the subject matter has been described above in the general context of computer-executable instructions of a computer program product that runs on a computer and/or computers, those skilled in the art will recognize that the one or more embodiments herein also can be implemented at least partially in parallel with one or more other program modules. Generally, program modules include routines, programs, components and/or data structures that perform particular tasks and/or implement particular abstract data types. Moreover, the aforedescribed computer-implemented methods can be practiced with other computer system configurations, including single-processor and/or multiprocessor computer systems, mini-computing devices, mainframe computers, as well as computers, hand-held computing devices (e.g., PDA, phone), and/or microprocessor-based or programmable consumer and/or industrial electronics. The illustrated aspects can also be practiced in distributed computing environments in which tasks are performed by remote processing devices that are linked through a communications network. However, one or more, if not all aspects of the one or more embodiments described herein can be practiced on stand-alone computers. In a distributed computing environment, program modules can be located in both local and remote memory storage devices.

As used in this application, the terms "component," "system," "platform" and/or "interface" can refer to and/or can include a computer-related entity or an entity related to an operational machine with one or more specific functionalities. The entities described herein can be either hardware, a combination of hardware and software, software, or software in execution. For example, a component can be, but is not limited to being, a process running on a processor, a processor, an object, an executable, a thread of execution, a program and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system and/or across a network such as the Internet with other systems via the signal). As another example, a component can be an apparatus with specific functionality provided by mechanical parts operated by electric or electronic circuitry, which is operated by a software and/or firmware application executed by a processor. In such a case, the processor can be internal and/or external to the apparatus and can execute at least a part of the software and/or firmware application. As yet another example, a component can be an apparatus that provides specific functionality through electronic components without mechanical parts, where the electronic components can include a processor and/or other means to execute software and/or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter described herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit and/or device comprising, but not limited to, single-core processors; single-processors with software multithread execution capability; multi-core processors; multi-core processors with software multithread execution capability; multi-core processors with hardware multithread technology; parallel platforms; and/or parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, and/or any combination thereof designed to perform the functions described herein. Further, processors can exploit nano-scale architectures such as, but not limited to, molecular and quantum-dot based transistors, switches and/or gates, in order to optimize space usage and/or to enhance performance of related equipment. A processor can be implemented as a combination of computing processing units.

Herein, terms such as "store," "storage," "data store," data storage," "database," and substantially any other information storage component relevant to operation and functionality of a component are utilized to refer to "memory components," entities embodied in a "memory," or components comprising a memory. Memory and/or memory components described herein can be either volatile memory or nonvolatile memory or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory and/or nonvolatile random-access memory (RAM) (e.g., ferroelectric RAM (FeRAM). Volatile memory can include RAM, which can act as external cache memory, for example. By way of illustration and not limitation, RAM can be available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM) and/or Rambus dynamic RAM (RDRAM). Additionally, the described memory components of systems and/or computer-implemented methods herein are intended to include, without being limited to including, these and/or any other suitable types of memory.

What has been described above includes mere examples of systems and computer-implemented methods. It is, of course, not possible to describe every conceivable combination of components and/or computer-implemented methods for purposes of describing the one or more embodiments, but one of ordinary skill in the art can recognize that many further combinations and/or permutations of the one or more embodiments are possible. Furthermore, to the extent that the terms "includes," "has," "possesses," and the like are used in the detailed description, claims, appendices and/or drawings such terms are intended to be inclusive in a manner similar to the term "comprising" as "comprising" is interpreted when employed as a transitional word in a claim.

The descriptions of the various embodiments have been presented for purposes of illustration but are not intended to be exhaustive or limited to the embodiments described herein. Many modifications and variations will be apparent to those of ordinary skill in the art without departing from the scope and spirit of the described embodiments. The terminology used herein was chosen to best explain the principles of the embodiments, the practical application and/or technical improvement over technologies found in the marketplace, and/or to enable others of ordinary skill in the art to understand the embodiments described herein.

What is claimed is:

1. A system, comprising:
 a first substrate having located thereon:
  a first quantum bit (qubit) located in a first quantum array connected to a first inductor loop coupled to a spiral resonator; and
 a second substrate, having located thereon:
  a second qubit located in a second quantum array connected to a second inductor loop, wherein the first substrate and second substrate are separate, and the first qubit and the second qubit are coupled via electrical interaction between the first inductor loop and the second inductor loop, wherein the spiral resonator enhances coupling between the first and second qubits.

2. The system of claim 1, further comprising a flux-tunable coupler configured to operate in two states, an ON state and an OFF state, wherein during operation in the ON state, the first qubit and the second qubit are coupled for entanglement to occur, and during operation in the OFF state, the first qubit and the second qubit are not coupled or entangled.

3. The system of claim 2, wherein the flux-tunable coupler further comprises a Superconducting Quantum Interference Device (SQUID) junction and operation of the flux-tunable coupler is switched between the ON state and the OFF state via an externally applied magnetic field to the SQUID junction.

4. The system of claim 3, wherein the flux-tunable coupler comprises a superconducting multimode qubit coupler.

5. The system of claim 3, wherein the flux-tunable coupler comprises a tunable transmission line shunted plasma oscillation (transmon) coupler.

6. The system of claim 1, wherein the first qubit is a first transmission line shunted plasma oscillation (transmon) qubit and the second qubit is a second transmon qubit.

7. The system of claim 1, wherein the spiral resonator is operated at a frequency higher than a frequency of the first qubit or the second qubit.

8. The system of claim 1, wherein the spiral resonator has an operational frequency in the range of 5.5 GHz to 6.5 GHz.

9. The system of claim 1, wherein the spiral resonator comprises at least niobium.

10. A quantum computing system, comprising:

at least one processor; and a memory operatively coupled to the at least one processor and having instructions stored thereon, wherein, in response to the at least one processor, the instructions facilitate performance of operations, comprising:

controlling operation of a flux-tunable coupler to couple a first qubit with a second qubit, the first qubit is connected to a first inductor loop and the second qubit is coupled to a second inductor loop, wherein the second inductor loop is proximate to the first inductor loop, and a spiral resonator is located proximate to the first inductor loop, wherein the first qubit is coupled to the second qubit via the first inductor loop and the second inductor loop, wherein the spiral resonator enhances coupling between the first and second qubits.

11. The quantum computing system of claim 10, wherein the flux-tunable coupler is configured to operate in two states, an ON state and an OFF state, wherein during operation in the ON state, the first qubit and the second qubit are coupled for entanglement to occur, and during operation in the OFF state, the first qubit and the second qubit are not coupled, wherein the flux-tunable coupler is connected to the first inductor loop.

12. The quantum computing system of claim 11, wherein the flux-tunable coupler further comprises a Superconducting Quantum Interference Device (SQUID) junction and an operation of the flux-tunable coupler is switched between the ON state and the OFF state via application of flux to the SQUID junction.

13. The quantum computing system of claim 10, wherein the first qubit is a first transmission line shunted plasma oscillation (transmon) qubit and the second qubit is a second transmon qubit.

14. The quantum computing system of claim 10, wherein the spiral resonator has a resonant frequency higher than a frequency of the first qubit or the second qubit during operation of the flux-tunable coupler.

15. The quantum computing system of claim 10, wherein the spiral resonator has a resonant frequency in the range of 5.5 GHz to 6.5 GHz.

16. The quantum computing system of claim 10, wherein the first qubit is located on a first integrated circuit (IC) and the second qubit is located on a second IC, the first IC and the second IC are co-located in a qubit array.

17. A computer-implemented method, comprising employing a processor and memory to instruct computer executable components to perform the following acts:

controlling operation of a flux-tunable coupler to couple a first qubit with a second qubit, the first qubit is connected to a first inductor loop and the second qubit is coupled to a second inductor loop, wherein the second inductor loop is proximate to the first inductor loop, and a spiral resonator is located proximate to the first inductor loop, wherein the first qubit is coupled to the second qubit via the first inductor loop and the second inductor loop, wherein the spiral resonator enhanced coupling between the first and second qubits.

18. The computer-implemented method of claim 17:

wherein the flux-tunable coupler is connected to the first inductor loop and further comprises a Superconducting Quantum Interference Device (SQUID) junction and an operation of the flux-tunable coupler is switched between an ON state and an OFF state via application of flux to the SQUID junction, during operation in the ON state, the first qubit and the second qubit are coupled for entanglement to occur, and during operation in the OFF state, the first qubit and the second qubit are not coupled.

19. The computer-implemented method according to claim 17, wherein the spiral resonator has a resonant frequency higher than a frequency of the first qubit or the second qubit during operation of the flux-tunable coupler.

20. The computer-implemented method of claim 17, wherein the first qubit is a first transmission line shunted plasma oscillation (transmon) qubit and the second qubit is a second transmon qubit.

\* \* \* \* \*